(12) United States Patent
Kawase et al.

(10) Patent No.: US 7,799,618 B2
(45) Date of Patent: Sep. 21, 2010

(54) METHOD OF MANUFACTURING SEMICONDUCTOR DEVICE, SEMICONDUCTOR DEVICE, DISPLAY DEVICE, AND ELECTRONIC INSTRUMENT

(75) Inventors: Takeo Kawase, Suwa (JP); Shinri Sakai, Suwa (JP)

(73) Assignee: Seiko Epson Corporation, Tokyo (JP)

( * ) Notice: Subject to any disclaimer, the term of this patent is extended or adjusted under 35 U.S.C. 154(b) by 859 days.

(21) Appl. No.: 11/391,462

(22) Filed: Mar. 29, 2006

(65) Prior Publication Data

US 2006/0249817 A1    Nov. 9, 2006

(30) Foreign Application Priority Data

Mar. 30, 2005    (JP)    ............................. 2005-099965

(51) Int. Cl.
   *H01L 21/00* (2006.01)
(52) U.S. Cl. ............................. 438/149; 257/E21.114
(58) Field of Classification Search ................. 438/149, 438/497, 30; 257/E21.114
   See application file for complete search history.

(56) References Cited

U.S. PATENT DOCUMENTS

| 4,902,638 A | 2/1990 | Muto |
| 4,907,861 A | 3/1990 | Muto |
| 7,258,955 B2 * | 8/2007 | Kishimoto et al. ............. 430/7 |
| 2005/0122351 A1 * | 6/2005 | Yamazaki et al. .............. 347/5 |
| 2006/0158482 A1 | 7/2006 | Nakamura et al. |

FOREIGN PATENT DOCUMENTS

| JP | A 61-245136 | 10/1986 |
| JP | A 2-275672 | 11/1990 |
| JP | A-02-275672 | 11/1990 |
| JP | A 05-338184 | 12/1993 |
| JP | A 11-207959 | 8/1999 |
| JP | A 2003-518754 | 6/2003 |
| JP | A-2005-024864 | 1/2005 |
| JP | A 2005-51199 | 2/2005 |
| JP | A 2005-64409 | 3/2005 |
| WO | WO 01/47043 A1 | 6/2001 |
| WO | WO 2004/097915 A1 | 11/2004 |

\* cited by examiner

*Primary Examiner*—Quoc D Hoang
(74) *Attorney, Agent, or Firm*—Oliff & Berridge, PLC

(57) ABSTRACT

A method of manufacturing a semiconductor device includes: forming a plurality of regions extending in a predetermined direction on a substrate; and ejecting a liquid material on the plurality of regions to form an electrically conductive film, wherein the electrically conductive film extends in the same direction as the plurality of regions so as to overlap the plurality of regions.

14 Claims, 9 Drawing Sheets

METHOD OF MANUFACTURING SEMICONDUCTOR DEVICE, SEMICONDUCTOR DEVICE, DISPLAY DEVICE, AND ELECTRONIC INSTRUMENT

BACKGROUND OF THE INVENTION

1. Technical Field

The present invention relates to a method of manufacturing a semiconductor device, a semiconductor device, a display device and an electronic instrument.

2. Related Art

As a method of forming a film with a predetermined pattern on a substrate, an etching method using a mask composed mainly of resin has been widely used (See JP-A-5-338184, for example.).

Specifically, the patterned film is obtained on the substrate by the following steps. I: A layer, which is composed of a material for forming the film, is formed on the substrate. II: A resist material is applied on the layer. III: A resist layer having openings corresponding to unnecessary portions of the layer is obtained by exposing and then developing the resist material. IV: Using the resist layer as a mask, the portions of the layer exposed inside the openings by an etching method. V: The mask is then removed.

However, according to the above method, it is time-consuming and troublesome to form the resist layer. As a result, problems such as a long time required for forming the film or increase in cost have arisen.

As the measure for solving such problems, in resent years, there is proposed a method of forming a film with a predetermined pattern by selectively supplying (dropping) areas for forming the film with droplets including a film material using a droplet ejecting method such as an inkjet method.

However, when the droplets are supplied on the substrate, the supplied droplets tend to spread on to wet the surface of the substrate in normal substrates, which do not absorb the droplets. Therefore, if a film with an elongated shape is to be formed, those having line widths larger than the diameter of the landed droplet can only be obtained in general.

As a method of reducing spreading and wetting, a method of increasing lyophobicity of the substrate against the droplets is also studied. However, in this case, the droplets supplied on the surface of the substrate form aggregated substances to decrease the superficial areas, namely to maintain the droplet shapes even on the substrate. Therefore, it has a strong tendency that the film with an even thickness cannot be obtained, or that breaking occurs in the middle of the film.

Taking the above into consideration, in forming the film having an elongated shape using the inkjet method, there is a limitation in a control of resolution of the film, in other words, a control of the width of the film as the case stands.

Meanwhile, in recent years, organic thin film transistors using organic materials (organic semiconductor materials) presenting electrically conductive properties similar to semiconductors are under development. The organic thin film transistors have advantages of good adaptability to low-profile and weight-saving, flexibility, low material cost and so on, and are expected to realize switching elements for flexible displays or the like.

As the organic thin film transistor, there is proposed one having a source electrode and a drain electrode formed on a substrate and an organic semiconductor layer, a gate insulating layer, and a gate electrode stacked on the electrodes in this order, which can be manufactured using an evaporation method or a coating method such as an inkjet method described above.

Although it is proposed that an inkjet method is used for forming the gate electrode of the organic thin film transistor, the line width of the gate electrode to be obtained tends to be too large in this case because of the reason described above (See JP-T-2003-518754, for example.).

And, if the line width becomes too large, the area of an overlapping section of the gate electrode and the source electrode increases, thereby problematically increasing the parasitic capacitance. Further, if the organic thin film transistor is used as a pixel transistor for a drive board of a display device, problems of a low aperture ratio and low display quality caused in accordance with the line width of the gate electrode arise.

SUMMARY

An advantage of the invention is to provide a method of manufacturing a semiconductor device capable of manufacturing a semiconductor device having an electrically conductive film with narrow width precisely formed along an a predetermined direction, a semiconductor device manufactured by the method of manufacturing a semiconductor device, a display device equipped with the semiconductor device, and an electronic instrument with high reliability.

The advantage described above is obtained by the present invention described below.

A method of manufacturing a semiconductor device according to an aspect of the invention includes the step of forming a plurality of regions extending in a predetermined direction on a substrate, and the step of ejecting a liquid material on the plurality of regions to form an electrically conductive film, wherein the electrically conductive film extends in the same direction as the plurality of regions so as to overlap the plurality of regions.

Accordingly, the semiconductor device having an electrically conductive film with narrow width precisely formed along an aiming direction can be manufactured.

A method of manufacturing a semiconductor device according to another aspect of the invention, includes the step of forming a semiconductor layer, a source electrode, and a drain electrode on a substrate, the step of forming a gate insulating layer on the semiconductor layer, the step of forming a plurality of regions extending in a predetermined direction on the gate insulating layer, and the step of ejecting a liquid material on the plurality of regions to form an electrically conductive film, wherein the electrically conductive film extends in the same direction as the plurality of regions so as to overlap the plurality of regions.

Thus, the semiconductor device having an electrically conductive film with narrow width (the gate electrode) precisely formed along an aiming direction can be manufactured.

In the method of manufacturing a semiconductor device according to this aspect of the invention, a distance among the plurality of regions A [nm] and a diameter B [nm] of the liquid material as landing satisfy a relationship that B/A is in a range of 3 through $3 \times 10^5$.

Thus, the narrower electrically conductive film (the gate electrode) can surely be formed.

In the method of manufacturing a semiconductor device according to another aspect of the invention, the plurality of regions is a plurality of grooves.

Thus, the liquid material (droplet) provided thereto can surely be extended in the same direction.

In the method of manufacturing a semiconductor device according to another aspect of the invention, the plurality of grooves is formed by rubbing the gate insulating film in the predetermined direction.

Thus, the grooves can surely be formed with relative ease.

The method of manufacturing a semiconductor device according to another aspect of the invention, includes the step of forming a plurality of lyophilic regions on the gate insulating layer presenting stronger lyophilicity to the liquid material than another region on the gate insulating layer prior to the step of ejecting the liquid material, wherein the plurality of regions is the plurality of lyophilic regions formed on the gate insulating layer.

Thus, the electrically conductive film can be formed so as to more surely overlap the plurality of regions.

In the method of manufacturing a semiconductor device according to another aspect of the invention, defining another region as a first region, and the lyophilic region as a second region, the first region and the second region are alternately disposed.

Thus, the electrically conductive film can be formed so as to further more surely overlap the plurality of regions.

In the method of manufacturing a semiconductor device according to another aspect of the invention, the liquid material is ejected from a nozzle of a droplet ejection device, and the electrically conductive film, defining a size in the extending direction as a length, has a width no greater than a diameter of the liquid material as landing.

Thus, the electrically conductive film (the gate electrode) can be formed to have relatively small width.

In the method of manufacturing a semiconductor device according to another aspect of the invention, the gate insulating layer is preferably composed mainly of an organic polymeric material.

Thus, the region extending in a predetermined direction can easily and surely be formed on the upper surface of the gate insulating layer.

In the method of manufacturing a semiconductor device according to another aspect of the invention, the liquid material preferably includes an electrically conductive material or a precursor thereof.

Thus, the electrically conductive film (the gate electrode) with good electrical conductivity can be formed.

In the method of manufacturing a semiconductor device according to another aspect of the invention, the source electrode and the drain electrode shape like comb teeth, and are preferably formed so as to engage with each other.

Thus, the areas in which either of the source electrode and the drain electrode overlaps the electrically conductive film (the gate electrode) can be reduced, thus preventing the area uncontrollable by the electrical field from the gate electrode from increasing. As a result, since increase in the off current of the thin film transistor can preferably be suppressed or prevented, the thin film transistor exerts preferable performance (switching performance).

A semiconductor device according to another aspect of the invention is manufactured by the method of manufacturing a semiconductor device according to any one of the above aspects of the invention.

The semiconductor device manufactured by the manufacturing method is equipped with the thin film transistor exerting a preferable performance (switching performance).

The semiconductor device according to another aspect of the invention includes a substrate provided with a semiconductor layer, a source electrode, and a drain electrode, an organic insulating layer provided on the semiconductor layer, a plurality of grooves extending in a predetermined direction formed on the organic insulating layer, and an electrically conductive film extending in the same direction as the grooves so as to overlap the plurality of grooves.

Thus, the semiconductor device equipped with a narrow electrically conductive film (a gate electrode) can be provided, and the thin film transistor implemented in the semiconductor device can exert preferable performance (switching performance).

A display device according to still another aspect of the invention includes the semiconductor device according to the above aspect of the invention.

Thus, degradation in the aperture ratio or the display quality can surely be prevented.

An electronic instrument according to still another aspect of the invention includes the display device according to the above aspect of the invention.

Thus, the electronic instrument with high reliability can be obtained.

BRIEF DESCRIPTION OF THE DRAWINGS

The invention will now be described with reference to the accompanying drawings, wherein like numbers refer to like elements.

DESCRIPTION OF THE EMBODIMENTS

Hereinafter, a method of manufacturing a semiconductor device, a semiconductor device, a display device, and an electronic instrument according to the invention are described in detail with reference to the accompanying drawings.

Note that the case in which a semiconductor device according to the invention is applied to an active matrix device is explained as an example.

First Embodiment

Firstly, an active matrix device and its manufacturing method of the first embodiment will now be explained.

Figure 1:
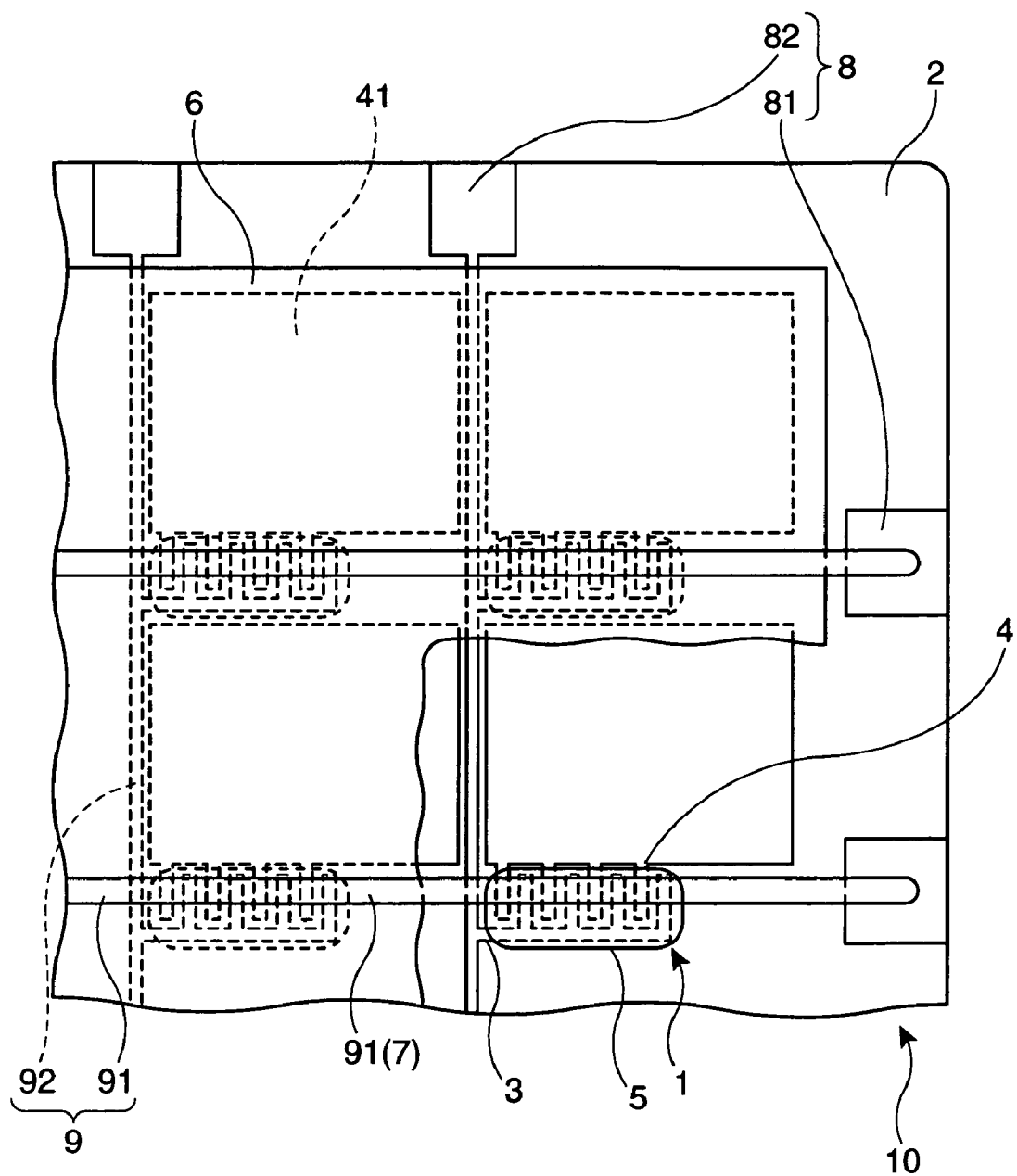
FIG. 1 is a plan view showing an active matrix device according to a first embodiment of the invention.
Figure 2A:
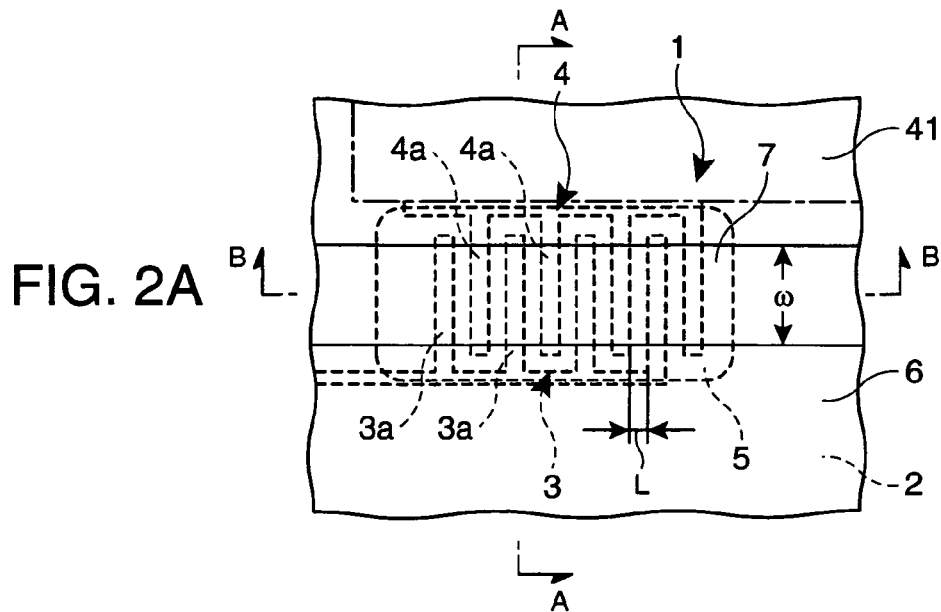
FIGS. 2A through 2C are enlarged views of the vicinity of the thin film transistor of the active matrix device shown in FIG. 1.
Figure 2B:
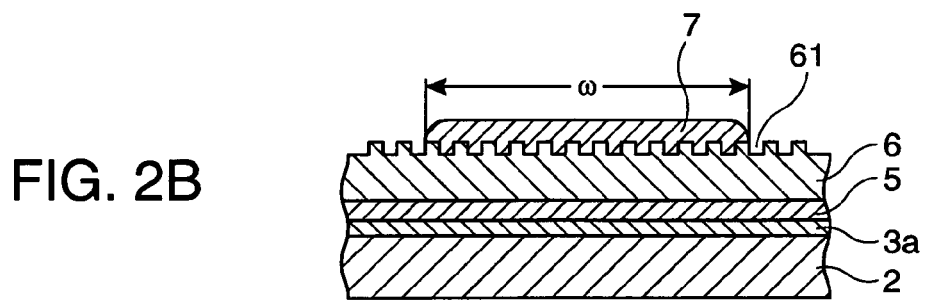
Figure 2C:
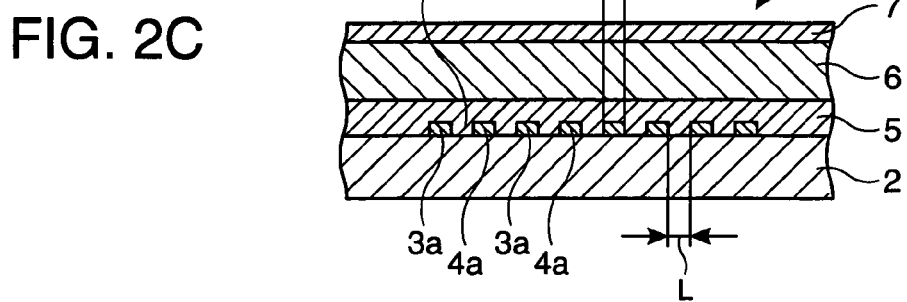

FIG. 1 is a plan view showing the active matrix device of the first embodiment. FIGS. 2A through 2C are enlarged views of the vicinity of a thin film transistor of the active matrix device show in FIG. 1, in which FIG. 2A is a plan view, FIG. 2B is a vertical cross-sectional view along the A-A line in FIG. 2A, and FIG. 2C is a vertical cross-sectional view along the B-B line in FIG. 2A. Note that in the following descriptions, the front side of the sheet on which FIGS. 1 and 2A are drawn is denoted as "upper side," the back side thereof is denoted as "lower side," and the upper sides of FIGS. 2B and 2C are denoted as "upper side," and the lower sides thereof are denoted as "lower side."

The active matrix device 10 shown in FIGS. 1 and 2 is composed of a substrate 2, pixel electrodes 41, organic thin film transistors 1 (hereinafter referred to as thin film transistors 1), connecting terminals 8, and wiring 9, wherein the parts denoted with 41, 1, 8, and 9 are formed on the substrate 2.

The substrate 2 is a support member for supporting the parts denoted with 1, 8, 9, and 41 provided thereon.

As the substrate 2, a plastic substrate (a resin substrate) made of polyimide, polyethylene terephthalate (PET), polyethylene naphthalate (PEN), polymethylmethacrylate (PMMA), polycarbonate (PC), polyethersulfone (PES), aromatic polyester (liquid crystal polymer), or the like, a grass substrate, a quartz substrate, a silicon substrate, a gallium arsenide substrate and so on, for example, can be used. If the active matrix device 10 needs to be made flexible, the resin substrate is selected as the substrate 2.

A foundation layer can be provided on the substrate 2. The foundation layer is provided for, for example, preventing ions from diffusing from the surface of the substrate 2, or for enhancing adhesiveness (joining property) of the parts denoted with 41, 1, 8, and 9 with the substrate 2.

A material for composing the fundamental layer is not particularly limited, but silicon oxide (SiO2), silicon nitride (SiN), polyimide, polyamide, or a polymer cross-linked to be insolubilized, and so on can preferably be used therefore.

Each of the pixel electrodes 41 forms one of the electrodes for applying a voltage for driving the respective one of the pixels when structuring an electrophoretic display device 20 described below using the active matrix device 10, and the pixel electrodes 41 are arranged in a matrix.

Each of the pixel electrodes 41 is connected to a drain electrode 4 equipped to respective one of the thin film transistors 1 arranged in a matrix. Therefore, by controlling the operations of the thin film transistors 1, driving of each of the pixels can be controlled in the electrophoretic display device 20 described below.

The thin film transistor 1 functions as a switching device for controlling ON/OFF of the pixel electrode 41, and includes the source electrode 3, the drain electrode 4, an organic semiconductor layer 5, a gate insulating layer 6, and a gate electrode 7. The thin film transistors 1 are arranged on the substrate 2 in a matrix corresponding to the pixel electrodes 41.

Note that a detail description of the thin film transistors 1 will be presented later.

The connection terminals 8 include a plurality of first terminals 81 and a plurality of second terminals.

The first terminals 81 and the second terminals 82 respectively form terminals to be connected to the drive ICs.

Further, the wiring is composed of a plurality of gate lines 91 and a plurality of data lines 92 provided substantially perpendicular to each of the gate lines 91.

In the present embodiment, the gate electrodes 7 corresponding to the source electrodes 3 and the drain electrodes 4 of the thin film transistors 1 arranged in one line integrally form a common electrode, which forms the gate line 91. Thus, the gate line 91 shapes like a line. And, each of the gate lines 91 is connected to respective one of the first terminals 81 at one end thereof.

By thus structuring the gate lines 91, a predetermined number of gate electrodes 7 can be formed together. As a result, the manufacturing time of the active matrix device 10 can be shortened.

Further, one end of each of the data lines 92 is connected to respective one of the second terminals 82. And, the source electrodes 3 of the thin film transistors 1 are connected to each of the data lines 92 at portions between the two ends thereof.

As a material of the pixel electrodes 41, connecting terminals 8 (the first terminal 81 and the second terminals 82), and the wiring 9 (the gate line 91 and the data lines 92), any materials having electrical conductivity can be used. For example, the same material as cited as the composing material of the source electrodes 3 and the drain electrodes 4 described later can be used. Accordingly, in a manufacturing process of the semiconductor described later, the source electrodes 3, the drain electrodes 4, the pixel electrodes 41, the connecting terminals 8, and the data lines 92 can be formed at the same time in the same process.

Hereinafter, the configuration of the thin film transistor 1 will be described.

The thin film transistor 1 shown in FIGS. 2A through 2C is provided on the substrate 2, and is composed of the source electrode 3 (electrode fingers 3a), the drain electrode 4 (electrode fingers 4a), the organic semiconductor layer (organic layer) 5, the gate insulating layer 6, and the gate electrode 7 stacked on the substrate 2 in this order.

Specifically, the thin film transistor 1 is provided on the substrate 2 with both of the source electrode 3 and the drain electrode 4 shaped like comb teeth engaged with each other, and further, with the organic semiconductor layer 5 having contacts with and covering the electrodes 3, 4. And, the gate insulating layer 6 is provided on the organic semiconductor layer 5 so as to have a contact therewith. And further, on the gate insulating layer 6, the gate electrode 7 is provided so as to overlap via the insulating layer 6 the area in which the teeth of the source electrode 3 and the drain electrode 4 are engaged with each other.

More specifically, the source electrode 3 and the drain electrode 4 respectively have electrode fingers 3a and 4a each aligned with a predetermined pitch and forming the comb-like shape as a whole. And further, these source electrode 3 and drain electrode 4 are provided so that the electrode fingers 3a and 4a are aligned alternately.

The thin film transistor 1 as described above is a transistor with a configuration in which the source electrode 3 and the drain electrode 4 are provided nearer to the substrate 2 than the gate electrode 7 via the gate insulating layer 6, namely a thin film transistor with the top-gate structure.

Hereinafter, each part of the thin film transistor 1 will be sequentially described.

The source electrode 3 and the drain electrode 4 are provided on the substrate 2 side by side along the channel length L direction with a predetermined distance so that the respective electrode fingers 3a, 4a of the source electrode 3 and the drain electrode 4 are aligned alternately.

In the thin film transistor 1, a part of the organic semiconductor layer 5 positioned between each of the electrode fingers (source electrode fingers) 3a of the source electrode 3 and each of the electrode fingers (drain electrode fingers) 4a of the drain electrode 4 is defined as a channel region through which carriers are transferred. Further, the length in the carrier transfer direction in the area between each of the electrode fingers 3a of the source electrode 3 and each of the electrode fingers 4a of the drain electrode 4, namely the distance between each of the electrode fingers 3a and 4a corresponds to the channel length L, and the product of (the length in the direction perpendicular to the channel length direction, namely the width ω of the gate electrode 7) and (the number N of the distances (gaps) between the electrode fingers 3a and 4a) makes the channel width W.

Note that, in the thin film transistor 1 in which the source electrode 3 and the drain electrode 4 are formed like comb teeth and the areas between respective electrode fingers 3a and 4a are defined as the channel region, the area of the section where the gate electrode 7 overlaps the source electrode 3 or the drain electrode 4 is determined by the width X of the electrode fingers 3a and 4a and the width ω of the gate electrode 7.

And, in the present embodiment, as described later, the source electrode 3 and the drain electrode 4 are formed using the resist layer formed by a lithography process as a mask. Therefore, the width X of each the electrode fingers 3a and 4a depends on the resolution of the lithography process, and since the resolution of the lithography process is extremely high, the width X can be narrowed.

Further, in the present embodiment of the invention, prior to forming the gate electrodes 7 using a droplet ejection method, a treatment for causing anisotropy in the extending direction of a droplet on the upper surface of the gate insulating layer 6 along the direction of forming the gate electrodes 7. Therefore, the gate electrodes 7 can be formed accurately along the desired direction. Further, since the droplet can be extended in a predetermined direction by priority, the extension (expansion) in a direction substantially perpendicular to the extending direction can be prevented, thus the gate electrodes 7 with smaller widths can be formed.

For the reason described above, the widths ω of the gate electrodes 7 can be made smaller than the width of the region where the electrode fingers 3a and the electrode fingers 4a are engaged so as to shape like comb teeth. Thus, it can preferably be prevented the region uncontrollable by the electrical field applied from the gate electrode 7 from increasing. As a result, since increase in the off current of the thin film transistor 1 can preferably be suppressed or prevented, the thin film transistor 1 exerts preferable performance (switching performance).

A composing material of the source electrodes 3 and the drain electrodes 4 are not particularly limited as long as it has electrical conductivity, and an electrically conductive material such as Pd, Pt, Au, W, Ta, Mo, Al, Cr, Ti, Cu, or an alloy including such metals, an electrically conductive oxide such as ITO, FTO, ATO, or $SnO_2$, a carbonaceous material such as carbon black, carbon nano tube, or fullerene, an electrically conductive polymeric material such as polyacetylene, polypyrrole, polythiophene such as PEDOT (poly-ethylenedioxythiophene), polyaniline, poly(p-phenylene), polyfluorene, polycarbazole, polysilane, or derivatives of the above, for example, can be cited and used alone or in combination as the composing material thereof. Note that the electrically conductive polymeric materials mentioned above are usually used after provided with conductivity by doping iron chloride, iodine, strong acid, organic acid, or polystyrene sulfonic acid to the polymer. In these materials, for each of materials composing the source electrode 3 and the drain electrode 4, materials composed mainly of Ni, Cu, Co, Au, Pd, or alloys including these metals are preferably used. By forming the source electrodes 3 and the drain electrodes 4 using such metallic materials, the electrodes 3, 4 can be formed easily and inexpensively with high accuracy using an electroless plating method in the process of forming the electrodes 3, 4 described later, thus the thin film transistor 1 with high performance can be obtained.

The thicknesses (in average) of the source electrode 3 and the drain electrode 4 are not limited, but are preferably in a range of about 30 through 300 nm, and are further preferably in a range of about 50 through 150 nm.

The width X of each of electrode fingers 3a and 4a is preferably equal to or less than 20 μm, and further preferably equal to or less than 10 μm.

Further, the distance (edge-to-edge distance) between the electrode finger 3a and the electrode finger 4a, namely the channel length L is preferably in a range of about 2 through 30 μm, and further preferably in a rage of about 3 through 20 μm. The smaller the channel length L is, the larger drain current can be controlled, and further, the smaller the capacitance of the gate electrode 7 can be made. However, if the channel length L is made smaller than the lower limit value described above, a photolithography technology with higher resolution is required for patterning the electrode, thus causing an increase in the cost. Further, even if the small channel length L is achieved, there are many cases in which the effectiveness does not reach an expected level in consequence of the contact resistance between the source electrode 3 and the organic semiconductor layer 5. In contrast, if the channel length L is greater than the upper limit value described above, the value of the drain current becomes smaller, which may cause an insufficient performance of the thin film transistor 1.

The channel width W (the product of the width ω of the gate electrode 7 and the number of the gaps between the electrode fingers 3a and the electrode fingers 4a) is preferably in a rage of about 0.05 through 5 mm, and further preferably in a range of about 0.1 through 3 mm. If the channel width W is narrower than the lower limit value mentioned above, the value of the drain current becomes smaller, which may cause an insufficient performance of the thin film transistor 1. In contrast, if the channel width W is wider than the upper limit value, the size of the thin film transistor 1 becomes larger, and an increase in the parasitic capacitance or an increase in the leak current to the gate electrode 7 via the gate insulating layer 6 may be resulted in.

Further, on the substrate 2, there is formed the organic semiconductor layer 5 so as to cover the source electrodes 3 and the drain electrodes 4 for allowing the carriers to be transferred from the source electrodes 3 to the drain electrodes 4.

The organic semiconductor layer 5 is made mainly of an organic semiconductor material (an organic material presenting with electrically conductive property similar to a semiconductor material).

The organic semiconductor layer 5 is preferably arranged substantially parallel to the channel length L direction at least in a channel region 51. According to this structure, the carrier mobility in the channel region 51 is increased resulting in the faster operational speed of the thin film transistor 1.

As the organic semiconductor material, for example, small molecule organic semiconductor materials such as naphthalene, anthracene, tetracene, pentacene, hexacene, phthalocyanine, perylene, hydrazone, triphenylmethane, diphenylmethane, stilbene, arylvinyl, pyrazoline, triphenylamine, triarylamine, oligothiophene, phthalocyanine, or derivatives of the above, or polymeric semiconductor materials such as poly-N-vinylcarbazole, polyvinylpyrene, polyvinylanthracene, polythiophene, polyhexylthiophene, poly(p-phenylenevinylene), a derivative thereof (e.g., MEH-PPV), polythenylenevinylene, polyarylamine, pyrene-formaldehyde resin, ehtylcarbazole-formaldehyde resin, fluorene-bithiophene copolymer, fluorene-arylamine copolymer, or derivatives of the above can be cited, and these materials can be used alone or in combination, and in particular, materials made mainly of polymeric organic semiconductor materials (conjugated polymeric materials) are preferably used. The conjugated polymeric materials have particularly high carrier migratory aptitude because of characteristic distributions of the electron clouds. Such polymeric organic semiconductor materials can be formed as films by a simple process, and easily arranged in a predetermined direction.

Further, in these materials, an organic semiconductor material composed primary of at least one of a copolymer including fluorene and bithiophene such as fluorene-bithiophene copolymer, a copolymer including arylamine such as polyarylamine or fluorene-arylamine copolymer, and derivatives thereof is preferable, and one composed primary of at least one of polyarylamine, fluorene-bithiophene copolymer, and derivatives thereof is preferable. Since such an organic semiconductor material has high water-resisting property and high oxidation resistance, the organic semiconductor layer 5 made of such an organic semiconductor material is prevented from degrading in the quality even if it is temporarily exposed to a high temperature and high humidity circumstance.

Further, the organic semiconductor layer 5 composed mainly of a polymeric organic semiconductor material, which can be used for forming thinner and/or lightweight products as well as excels in flexibility, is suitable for an application to thin film transistors used as switching elements for flexible displays.

The thickness (in average) of the organic semiconductor layer 5 is preferably in a range of about 0.1 through 1000 nm, and more preferably in a range of about 1 through 500 nm, and further more preferably in a range of about 10 through 100 nm.

Note that the organic semiconductor layer 5 is not limited to those provided so as to cover the source electrodes 3 and the drain electrodes 4, but can be formed on at least areas (the channel regions 51) defined between the source electrodes 3 and the drain electrodes 4.

Further, the configuration in which the source electrodes 3 and the drain electrodes 4 coated with a electrically conductive material or a semiconductor material are covered by the organic semiconductor layer 5 can also be adopted.

On the organic semiconductor layer 5, there is provided the gate insulating layer 6 covering the source electrodes 3 and the drain electrodes 4 and abutting on the organic semiconductor layer 5.

The gate insulating layer 6 is provided for insulating the gate electrode 7 from the source electrodes 3 and the drain electrodes 4.

On the upper surface of the gate insulating layer 6, there are formed (by executing a physical treatment) a number of grooves 61 along a direction in which the gate electrode 7 is formed as shown in FIG. 2B. The grooves 61 are formed for causing anisotropy in the extending direction of liquid material droplets for forming the gate electrode 7.

The gate insulating layer 6 is preferably composed mainly of an organic material (in particular an organic polymeric material). The gate insulating layer 6 composed mainly of an organic polymeric material is easy to be formed, and capable of enhancing adhesiveness with the organic semiconductor layer 5. Moreover, since the gate insulating layer 6 composed mainly of an organic polymeric material is easy to be reprocessed after it has been once formed, the grooves 61 can easily and surely be formed on the upper surface of the gate insulating layer 6.

As such an organic polymeric material, for example, acrylic resin such as polystyrene, polyimide, polyamideimide, polyvinylphenylene, polycarbonate (PC), or polymethylmethacrylate (PMMA), fluorinated resin such as polytetrafluoroethylene (PTFE), phenolic resin such as polyvinylphenol (PVP) or novolak resin, olefinic resin such as polyethylene, polypropylene, polyisobutylene, or polybutene can be cited, and can be used alone or in combination.

The thickness (in average) of the gate insulating layer 6 is not particularly limited, but is preferably in a range of about 10 through 5000 nm, and is further preferably in a range of about 100 through 1000 nm. By arranging the thickness of the gate insulating layer 6 within the range described above, the thin film transistor 1 can be prevented from becoming larger (in particular, increasing the thickness thereof) while surely insulating the source electrode 3 and the drain electrode 4 from the gate electrode 7.

Note that the gate insulating layer 6 is not limited to be of a single layer structure, but can be of a stacked layer structure including a plurality of layers.

Further, as the composing material of the gate insulating layer 6, for example, an inorganic insulating material such as $SiO_2$ can be used. In this case, as the gate insulating layer 6, $SiO_2$ can be obtained from a liquid material by coating a solution such as polysilicate, polyciloxane, or polysilazane and then heating the coated film under existence of oxygen or water vapor. Further, by coating a metal alkoxide solution and then heating it under the oxygen environment, an inorganic insulating material can be obtained (which is known as the sol-gel process).

On the gate insulating layer 6, there are formed gate electrodes 7 insulated from the source electrodes 3 and the drain electrodes 4 via the gate insulating layer 6.

As a composing material of the gate electrodes 7, the same material as the composing material of the source electrodes 3 and the drain electrodes 4 described above can be used.

The thickness (in average) of the gate electrode 7 is not particularly limited, but is preferably in a range of about 0.1 through 5000 nm, and more preferably in a range of about 1 through 5000 nm, and further more preferably in a range of about 10 through 5000 nm.

The width ω (in average) of the gate electrode 7 is enough to be a size capable of covering in just proportion the area between the source electrode 3 and the drain electrode 4 both facing the gate electrode 7, and not particularly limited, but is preferably in a range of about 0.1 through 200 μm, more preferably in a range of about 1 through 50 μm, and further more preferably in a range of about 5 through 30 μm.

By setting the width ω of the gate electrode 7 in the above range, the channel width W can surely be prevented from becoming large, thus the parasitic capacitance and the leakage current to the gate electrode 7 through the gate insulating layer 6 can surely be prevented from increasing.

Moreover, since the area occupied by the gate electrodes 7 (gate wiring 91) in the active matrix device 10 can be reduced, the area occupied by the pixel electrodes 41 can be increased. As a result, if the active matrix device 10 is applied to a display device described below, enhancement of the aperture ratio and display quality of the display can be achieved.

In the active matrix device 10 described above, the amount of current flowing between the source electrode 3 and the drain electrode 4, namely the current supplied to the pixel electrode 41, can be controlled by altering the voltage applied to the gate electrode 7 of the thin film transistors 1.

In other words, in an OFF state in which no voltage is applied to the gate electrode 7, even if some voltage is applied between the source electrode 3 (the electrode fingers 3a) and the drain electrode 4 (the electrode fingers 4a), only vary little current flows because carriers hardly exist in the organic semiconductor layer 5. In contrast, in an ON state in which a substantial voltage is applied to the gate electrode 7, movable electrical charges (carriers) are induced in a part of the organic semiconductor layer 5 facing the gate insulating layer 6 to form a flow channel for the carrier in the channel region 51. In this condition, if substantial voltage is applied between the source electrode 3 and the drain electrode 4, the current flows through the channel region 51.

Note that, although in the present embodiment descriptions are presented regarding those having configurations in which both of the source electrode 3 and the drain electrode 4 shape like comb teeth and are formed so as to engage with each other, the shapes of the electrodes 3 and 4 are not so limited, but a configuration in which both of the electrodes 3 and 4 are formed to be substantially rectangle and provided adjacent to each other with a predetermined distance, for example, can be adopted.

Further, as a thin film transistor for implemented in the active matrix device, one having a top-gate structure is explained as an example, but the thin film transistor is not limited to such a structure, and can be of a bottom-gate structure.

The active matrix device 10 described above can be manufactured as follows, for example.

Hereinafter, a method of manufacturing the active matrix device 10, namely a method of manufacturing a semiconductor device according to the invention will be described.

Figure 3A:
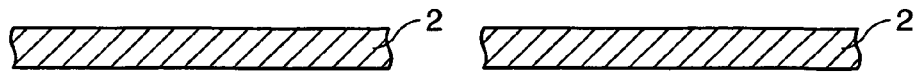
FIGS. 3A through 3E are vertical cross-sectional views for explaining a method of forming the thin film transistor implemented in the active matrix device of the first embodiment.
Figure 3B:
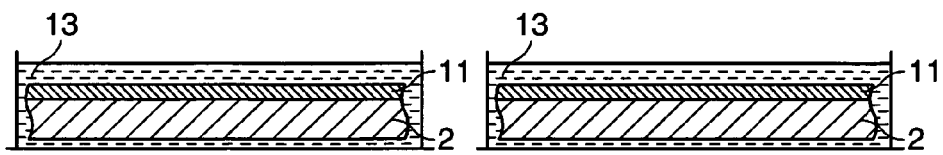
Figure 3C:
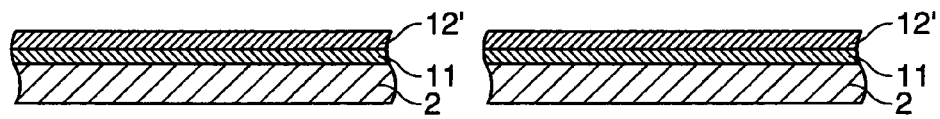
Figure 3D:
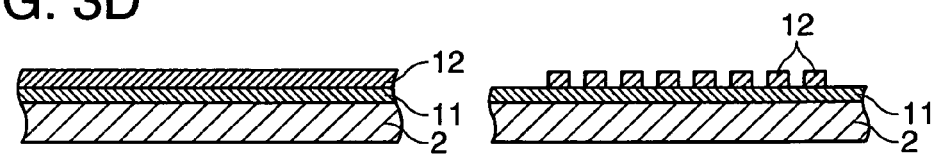
Figure 3E:
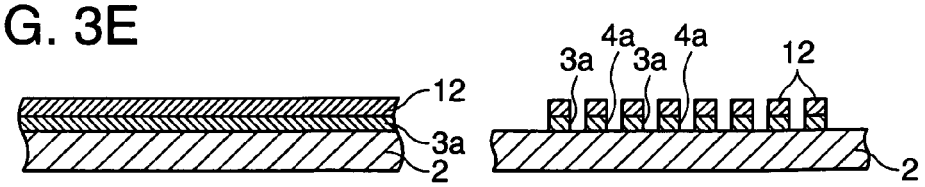
Figure 4A:
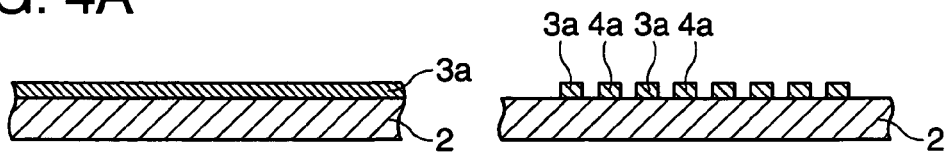
FIGS. 4A through 4E are vertical cross-sectional views for explaining a method of forming the thin film transistor implemented in the active matrix device of the first embodiment.

Each of FIGS. 3A through 3E and 4A through 4E is a vertical cross-sectional view for explaining a process of forming a thin film transistor implemented in the active matrix of the first embodiment, where one along the A-A line in FIG. 2A is shown in the left and one along the B-B line in FIG. 2A is shown in the right, respectively. Further, FIGS. 5A through 5C are schematic views (perspective views) showing how the droplet anisotropically extends. Note that the upper side of FIGS. 3A through 3E and 4A through 4E is referred to as "upper side" and the lower side thereof is referred to as "lower side" in the following descriptions.

The method of manufacturing the active matrix device 10 includes (1) a step of forming the source electrodes, the drain electrodes, the pixel electrodes, the wiring, and the connecting terminals, (2) a step of removing organic matters, (3) a step of forming the organic semiconductor layer, (4) a step of forming the gate insulating layer, (5) a step of processing the gate insulating layer, and (6) a step of forming the wiring (the gate electrodes). Hereinafter, each of these steps will sequentially be explained.

Step of Forming Source Electrodes, Drain Electrodes, Pixel Electrodes, Wiring, and Connecting Terminals Firstly, the source electrodes 3, the drain electrodes 4, the pixel electrodes 41, the connecting terminals 8, and the data lines 92 are formed on the substrate 2.

These can be formed by forming a film (an electrically conductive film) composed of a electrically conductive material using, for example, a chemical vapor deposition (CVD) process such as a plasma CVD process, a thermal CVD process or a laser CVD process, a dry plating process such as a vacuum evaporation process, a sputtering process or a ion plating process, a wet plating process such as an electrolytic plating process, an immersion plating process or an electroless plating process, a thermal spraying process, a sol-gel process, or a MOD process, and then removing an unnecessary part therefrom.

In particular, the electrically conductive film is preferably formed using an electroless plating process. By using the electroless plating process, the source electrodes 3, the drain electrodes 4, the pixel electrodes 41, the connecting terminals 8, and the data lines 92 can easily be formed with low cost and high film forming accuracy without requiring large-scale facilities such as vacuum equipment.

In the following descriptions, the case in which an electroless plating process is used for forming the source electrodes 3, the drain electrodes 4, the pixel electrodes 41, the connecting terminals 8, and the data lines 92 is explained as an example.

1-I. Firstly, the substrate 2, as shown in FIG. 3A, is provided and then cleaned with, for example, water (purified water or the like), an organic solvent, or the like alone or in combination as desired. Thus, the wettability of the substrate 2 to water is improved to easily contact with various processing liquids shown below.

Note that, if a resin substrate made of, for example, polyimide is used as the substrate 2, the surface of the substrate 2, to which the source electrodes 3, the drain electrodes 4, the pixel electrodes 41, the connecting terminals 8, and the data lines 92 are to be formed, is preferably executed with a process for enhancing the adhesiveness to these elements prior to the present step (1-I) (the step (1)).

The process (surface roughening) for enhancing the adhesiveness is executed by etching the surface of the substrate 2 with the etching liquid and then treating with processing liquid including a reducing agent.

As the etching liquid, for example, a liquid including a transition metal oxide such as $CrO_3$ or $MnO_2$, or an inorganic acid such as sulfuric acid or hydrochloric acid can be used.

Meanwhile, the reducing agent used for the processing liquid is not particularly limited, but is preferably selected from those substantially free of alkali metals. Thus, since no alkali metal ion is captured by the surface of the substrate 2, the alkali metal ions are prevented from diffusing to (interfusing in) the organic semiconductor layer 5 formed in a process executed later, and as a result, deterioration of the performance of the organic semiconductor layer 5 can be prevented.

As such a reducing agent, ammonium compounds such as ammonium sulfite hydrate or ammonium hypophosphite, or hydrazine or the line can be cited. In these reducing agents, those composed mainly of ammonium compounds are preferable, and those composed mainly of ammonium sulfite hydrate are further preferable. The ammonium compounds (in particular ammonium sulfite hydrates) are preferable because of their superior reduction performance.

1-II. Subsequently, preprocessing for forming a plated film 11 is executed on the substrate 2.

This preprocessing is executed by, for example, bringing a solution (surface-active solution) including a cationic surface-active agent or an anionic surface-active agent into contact with the substrate 2. By thus treated, the cationic surface-active agent or the anionic surface-active agent is attached on the surface of the substrate 2.

The surface of the substrate 2 is positively charged when the cationic surface-active agent is attached, or is negatively charged when the anionic surface-active agent is attached. If the charge polarity of a catalytic agent used in the electroless plating process is opposite to the charge polarity of the substrate, the catalytic agent is easy to be attached thereto, and consequently, the adhesiveness of the substrate 2 with the plated film 11 (the source electrodes 3, the drain electrodes 4, the pixel electrodes 41, the connecting terminals 8, and the data lines 92) to be formed thereon is improved.

As the method of bringing the surface-active solution into contact with the substrate 2, for example, a method of dipping the substrate 2 into the surface-active solution (a dipping method) and a method of spraying the surface-active solution onto the substrate 2 can be cited. The dipping method is particularly preferable because the substrate 2 of a large amount and a large size can easily be processed by the dipping method.

Although various methods can be used as the method of bringing the liquid into contact with the substrate 2 as described above, the case in which the dipping method is used as the liquid contact method is described as an example in the following steps.

As the cationic surface-active agent, for example, alkyl ammonium chloride, benzalkonium chloride, benzethonium chloride, stearic acid, and so on can be cited, and can be used alone or in combination.

The temperature of the surface-active solution actually used in the process is preferably in a range of about 0 through 70° C., and further preferably in a range of about 10 through 40° C.

Further, the process time of the substrate 2 in the surface-active solution is preferably in a range of about 10 through 90 seconds, and further preferably in a range of about 30 through 60 seconds.

The substrate 2 thus preprocessed is then cleaned using, for example, purified water (ultra pure water), ion exchanged water, distilled water, or RO water.

1-III. Subsequently, the catalytic agent is attached on the surface of the substrate 2.

As the catalytic agent, Au, Ag, Pd, Pt, Ni, and so on can be cited, and can be used alone or in combination.

In the case in which Pd out of these agents is used as the catalytic agent, the substrate 2 is dipped in colloidal suspension of a Pd alloy such as Sn—Pd or solution of an ionic Pd catalytic agent such as palladium chloride to attach the Pd alloy or the ionic Pd catalytic agent on the surface of the substrate 2. After then, Pd is exposed on the surface of the substrate 2 by removing elements, which are not involved in the catalytic action.

In the case in which the Sn—Pd colloidal suspension is used, for example, the substrate 2 is dipped in acidic solution after being dipped in the colloidal suspension. Thus, Sn coordinated with Pd is dissolved to be removed resulting in a condition in which Pd is exposed on the surface of the substrate 2.

As the acidic solution, for example, a solution including an acid such as $HBF_4$ and a reducing agent such as glucose, or a solution made by adding sulfuric acid to the aforementioned solution can be used.

The temperature of the solution including the catalytic agent actually used in the process is preferably in a range of about 0 through 70° C., and further preferably in a range of about 10 through 40° C.

The process time of the substrate 2 in the solution including the catalytic agent is preferably in a range of about 10 seconds through 5 minutes, and further preferably in a range of about 20 seconds through 3 minutes.

Meanwhile, the temperature of the acidic solution actually used in the process is preferably in a range of about 0 through 70° C., and further preferably in a range of about 10 through 40° C.

The process time of the substrate 2 in the acidic solution is preferably in a range of about 10 seconds through 5 minutes, and further preferably in a range of about 30 seconds through 3 minutes.

The substrate 2, to which the catalytic agent is thus attached (absorbed), is cleaned using, for example, purified water (ultra pure water), ion exchanged water, distilled water, or RO water.

1-IV. Subsequently, as shown in FIG. 3B, the substrate 2 is dipped in the plating solution 13, and the metallic element (simple metallic element) is precipitated on the surface of the substrate 2 to form the plated film 11.

Incidentally, as the plating solution 13 used for electroless plating, those including a metallic salt of the metal for forming the plated film 11 (the source electrodes 3, the drain electrodes 4, the pixel electrodes 41, the connecting terminals 8, and the data lines 92) and the reducing agent, but not substantially including any alkali metal ions are preferably used.

Namely, although the plating solution 13 is prepared by resolving at least the metallic salt and the reducing agent into the solvent, those not including alkali metal as their constituent elements are preferably used as the composing material.

Thus, the alkali metal ions can be prevented from being mixed into the resulting plated film 11. As a result, the alkali metal ions can be prevented from being diffused (mixed) into the organic semiconductor layer 5 to be formed in the following step to prevent the performance of the organic semiconductor layer 5 from deteriorating.

As the metallic salt, for example, sulfate salt, nitrate salt, or the like is preferably used.

As the reducing agent, for example, hydrazine, ammonium hypophosphite, and so on can be cited. Among these agents, those composed mainly of at least one of hydrazine and ammonium hypophosphite are more preferable. By using these materials as the reducing agent under appropriate plating solution temperature and appropriate plating solution pH, the speed of forming the plated film 11 is made proper, which makes it easy to control the thickness of the film within the optimum range of the film thickness required to the source electrodes 3, the drain electrodes 4, the pixel electrodes 41, the connecting terminals 8, and the data lines 92. Further, the resulting plated film 11 can also have an even thickness and preferable surface property (high film surface morphology).

The amount of the metallic salt included in the plating solution 13 (the amount of the metallic salt added to the solvent) is preferably in a range of about 1 through 50 g/L, and further preferably in a range of about 5 through 25 g/L. If the content of the metallic salt is too small, it may take a long time to form the plated film 11. In contrast, if the content of the metallic salt is increased beyond the upper limit described above, the effectiveness is not expected to be increased.

Further, the amount of the reducing agent included in the plating solution 13 (the amount of the reducing agent added to the solvent) is preferably in a range of about 10 through 200 g/L, and further preferably in a range of about 50 through 150 g/L. If the amount of the reducing agent is too small, it may be difficult to efficiently reduce the metallic ions depending on the nature of the reducing agent. In contrast, if the content of the reducing agent is increased beyond the upper limit described above, increase in the effectiveness is not expected.

It is preferable that a pH adjuster (a pH buffer) is further mixed (added) to such a plating solution 13. Thus, it can be prevented or controlled that the pH of the plating solution 13 is lowered as electroless plating proceeds, and as a result, slow-down of the deposition rate or changes in composition or characteristics of the plated film 11 can effectively be prevented.

As such a pH adjuster, various kinds can be cited. Those composed mainly of at least one of ammonia water, trimethyl ammonium hydride, and ammonium sulfide are preferable. Since these materials excel in buffering behavior, the aforementioned effect is remarkably exerted by using these materials as the pH adjustor.

By dipping the substrate 2 having the catalytic agent attached thereto into the plating solution 13 described above, the electroless plating reaction is promoted with the nucleate catalytic agent, thus forming the plated film 11.

The pH of the plating solution 10 actually used in the process is preferably in a range of about 5 through 12, and further preferably in a range of about 6 through 10.

The temperature of the plating solution 13 actually used in the process is preferably in a range of about 30 through 90° C., and further preferably in a range of about 40 through 80° C.

The process time of the substrate 2 in the plating solution 13 is preferably in a range of about 10 seconds through 5 minutes, and further preferably in a range of about 20 seconds through 3 minutes.

By arranging the pH and the temperature of the plating solution 13 and the process time by the plating solution 13 within the ranges mentioned above, the deposition rate becomes particularly proper, and accordingly the plated film 11 having an even thickness can be formed with high precision.

Note that the thickness of the resulting plated film 11 can be controlled by arranging the plating conditions such as the operation temperature (the temperature of the plating solution), the operation time (the plating time), the amount of the plating solution, the pH of the plating solution, or the number of plating processes (the number of turns).

Further, some additives such as a complexing agent, or a stabilizing agent can be added to the plating solution 13 if necessary.

As the complexing agent, for example, carboxylic acid such as ethylenediamine tetra acetic acid or acetic acid, oxycarboxylic acid such as tartaric acid or citric acid, aminocarboxylic acid such as glycine, amine such as triethanolamine, and multiple alcohol such as glycerin or sorbitol can be cited.

As the stabilizing agent, for example, 2,2'-bipyridyl, cyanide, ferrocyanide, phenanthroline, thiourea, mercapt benzothiazole, thioglycolic acid, and so on can be cited.

The substrate 2 on which the plated film 11 is thus formed is cleaned using, for example, purified water (ultra pure water), ion exchanged water, distilled water, or RO water.

1-V. Subsequently, the resist layer 12 having a shape corresponding to the source electrodes 3, the drain electrodes 4, pixel electrodes 41, the connecting terminals 8, and the data lines 92 is formed on the plated film 11.

Firstly, as shown in FIG. 3C, resist material 12' is applied (provided) on the plated film 11. Then, it is exposed via a photo mask corresponding to the shapes of the source electrodes 3, the drain electrodes 4, the pixel electrodes 41, the connecting terminals 8, and the data lines 92, and then developed with developing liquid. According to the above, the resist layer 12 patterned to have the shape corresponding to the source electrodes 3 and the drain electrodes 4 as shown in FIG. 3D, and further to the data lines 92, the pixel electrodes 41, and the connecting terminals 8 not shown in the drawings can be obtained.

1-VI. Then, using the resist layer 12 as a mask, unnecessary portions of the plated film 11 are removed by etching, as shown in FIG. 3E.

In this etching process, one or more of processes including physical etching methods such as plasma etching, reactive etching, beam etching, or photo-assist etching, and chemical etching methods such as wet etching can be executed alone or in combination. The wet etching is preferably used among these etching processes. Thus, the etching process can be executed with simple equipment and steps without using any large-scale equipment such as a vacuum device.

As an etching liquid used for the wet etching, for example, a solution including iron chloride, and a solution including sulfuric acid, nitric acid, or acetic acid can be cited.

1-VII. And then, by removing the resist layer 12, the source electrodes 3 and the drain electrodes 4 as shown in FIG. 4A, and further, the data lines 92, the pixel electrodes 41, and the connecting terminals 8 not shown can be obtained.

Although a resist removing liquid such as a monoehtanolamine dimethyl sulfoxide compound liquid is preferably used for removing the resist layer 12, other methods such as, for example, the physical etching method mentioned above can also be used.

Note that, while removing the resist layer 12 using the resist removing liquid, the resist layer 12 is preferably vibrated by applying ultrasonic waves. Thus, the resist layer 12 can more surely be removed.

As described above, by using the photolithography method and the etching method in combination, the source electrodes 3, the drain electrodes 4, the pixel electrodes 41, the connecting terminals 8, and the data lines 92 with high dimensional accuracy can easily and surely be formed.

Therefore, the widths of the electrode fingers 3a and 4a and the distance (the channel length L) between the electrode fingers 3a and the electrode fingers 4a can be set to be comparatively shorter, thus providing the thin film transistor 1 with low absolute value of the threshold voltage and large drain current, namely excelling at characteristics necessary for switching elements.

Note that either of a negative type of resist material and a positive type of resist material can be used as the resist material of the photolithography method.

Note that, although in the present embodiment, as the method of forming the source electrodes 3, the drain electrodes 4, the pixel electrodes 41, the connecting terminals 8, and the data lines 92, the method of forming the resist layer 12 on the plating film 11 provided on the substrate and then removing the unnecessary portions of the plating film 11 by etching is described, the following method can be used for forming the sections 3, 4, 41, 8, and 92 as substitute thereof.

Namely, the resist layer 12 having openings corresponding to the shapes of the sections 3, 4, 41, 8, and 92 is formed on the substrate 2, and then the substrate 2 provided with the resist layer 12 is dipped in the plating liquid 13. Thus, the plating films corresponding to the shapes of the sections 3, 4, 41, 8, and 92 are formed. And then, by separating the resist layer 12 therefrom, the sections 3, 4, 41, 8, and 92 can be obtained.

Further, if a vacuum evaporation process other than the electroless plating process described above is used, the source electrodes 3, the drain electrodes 4, the pixel electrodes 41, the connecting terminals 8, and the data lines 92 can be formed, for example, as described below. Note that the case in which one having Cr of Ti as an adhering layer (foundation layer) and Au as a coating layer is formed will hereinafter be explained as an example. By making the source electrodes 3, the drain electrodes 4, the pixel electrodes 41, the connecting terminals 8, and the data lines 92 have such structures, these elements become to exert excellent electrical conductivity.

1'. Step of Forming Source Electrodes, Drain Electrodes, Pixel Electrodes, Wiring, and Connecting Terminals 1-I. Firstly, the substrate 2 is provided and is cleaned with an organic solvent such as acetone or isopropanol (IPA) used alone or in combination as a desire.

Note that the cleaning of the substrate 2 is preferably executed while applying ultrasonic waves. Thus, the adhesiveness of the adhering layer formed in the succeeding step, the step 1'-II can be improved.

1'-II. Subsequently, the adhering layer made of Cr or Ti is formed on the surface of one side of the substrate 2 using a vacuum evaporation process.

The formation of the adhering layer can be carried out by heating an adhering layer forming material made of Cr or Ti while setting the substrate 2 and the adhering layer forming material inside a chamber.

The pressure in the chamber is enough to be set as low as possible and is not particularly limited, but preferably in a rage of about $1\times10^{-5}$ through $1\times10^{-1}$ Torr.

The thickness of the adhering layer is preferably no greater than 10 nm, and further preferably in a rage of about 2 through 5 nm.

1'-II. Subsequently, the coating layer made of Au is formed on the surface of the adhering layer using a vacuum evaporation process.

The formation of the coating layer can be carried out by the same process as described with respect to the step 1'-II using a coating layer forming material made of Au.

1'-IV. Subsequently, the resist layer having a shape corresponding to the source electrodes 3, the drain electrodes 4, pixel electrodes 41, the connecting terminals 8, and the data lines 92 is formed on the coating layer. The resist layer can be formed by the same process as described with respect to the step 1-V.

1'-V. Subsequently, using the resist layer as a mask, unnecessary portions of the coating layer and the adhering layer are removed by etching.

As the etching process, the same process as described with respect to the step 1-VI can be used. When a chemical etching process is used, an iodine/potassium iodide compound liquid is preferably used as the etching liquid for the coating (Au) layer, and a diammonium cerium nitrate/perchloric acid aqueous solution is preferably used as the etching liquid for adhering (Cr or Ti) layer.

1'-VI. Subsequently, the resist layer 12 is removed.

The removal of the resist layer can be carried out using the same process as described with respect to the step 1-VII.

Using the steps described above, the source electrodes 3, the drain electrodes 4, the pixel electrodes 41, the connecting terminals 8, and the data lines 92 composed of the adhering layer and the coating layer with high dimensional accuracy can easily and surely be formed.

Note that, although in the present embodiment, as the method of forming the source electrodes 3, the drain electrodes 4, the pixel electrodes 41, the connecting terminals 8, and the data lines 92, the method of forming the resist layer on the coating layer provided on the substrate and then removing the unnecessary portions of the coating layer and the adhering layer by etching is described, the following method can be used for forming the sections 3, 4, 41, 8, and 92 as substitute thereof.

Namely, a resist layer having openings corresponding to the shapes of the sections 3, 4, 41, 8, and 92 is formed on the substrate 2. And then, the substrate 2 having the resist layer formed thereon is placed inside the chamber, and the adhering layer and the coating layer corresponding to the shapes of the sections 3, 4, 41, 8, and 92 are sequentially formed (stacked). After then, by separating the resist layer therefrom, the sections 3, 4, 41, 8, and 92 can be obtained.

Step of Removing Organic Matters

Subsequently, the substrate 2 having the source electrodes 3, the drain electrodes 4, the pixel electrodes 41, the connecting terminals 8, and the data lines 92 formed thereon is cleaned using, for example, water (purified water or the like) or organic solvents alone or in combination as a desire.

After then, any organic matters existing on the surface of the substrate 2, on which the organic semiconductor layer 5 is to be formed, are removed. Thus, the barrier for the carrier in the interfaces between the organic semiconductor layer 5 and both of the source electrode 3 and the drain electrode 4 can be removed to improve the performance of the thin film transistor 1.

As the method (the removing method) of removing organic matters, for example, a plasma process, a process with ozone water, etching with an acid or an alkali, mechanical removal of the surface layer, and UV (in particular, deep UV) irradiation can be cited, and these processes can be used alone or in combination. Among these processes, the plasma process is preferable as the method of removing the organic matters. According to the plasma process, the organic matters can surely be removed in a short period of time.

When executing the plasma process, the substrate 2 is carried in a chamber equipped with a decompression means and a plasma generation means, and can be processed by generating plasma in the chamber in a decompressed condition, or by ejecting plasma against the surface of the substrate from a head equipped with a plasma ejection nozzle.

According to the latter method, since the plasma process (atmospheric pressure plasma process) can be executed under the atmospheric pressure, the chamber and the decompression means can be omitted to provide advantages of low manufacturing cost and short turn around time in manufacturing.

In the conditions of the atmospheric pressure plasma process, for example, the gas flow rate is in a range of about 10 through 300 sccm, and the RF power is in a range of about 0.005 through 0.2 W/cm².

The gas used for generating plasma is not particularly limited, but those composed mainly of at least one of oxygen, nitrogen, argon, helium, and fluorocarbon are preferably used therefor. Since plasma can be generated in relatively low vacuum atmosphere or under the atmospheric pressure by mixing argon or helium with the main component, the equipment can be simplified.

Note that the present step 2 can be omitted according to need.

Step of Forming Organic Semiconductor Layer

Figure 4B:
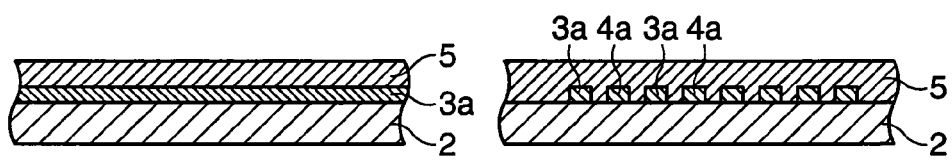
Figure 5A:
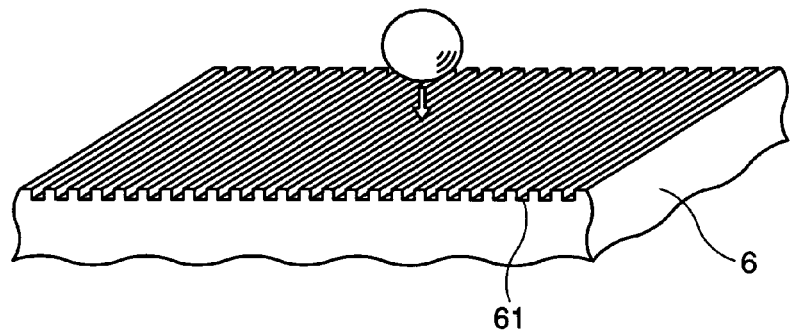
FIGS. 5A through 5C are schematic views (perspective views) showing how the droplet anisotropically extends.
Figure 5B:
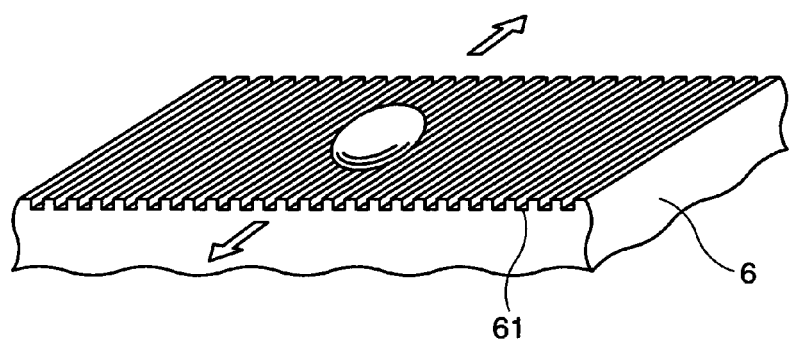
Figure 5C:
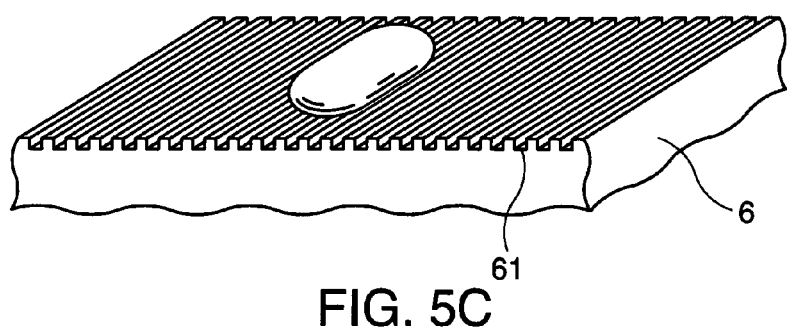

Then, as shown in FIG. 4B, the organic semiconductor layer 5 is formed on the substrate 2 having the source electrodes 3, the drain electrodes 4, the pixel electrodes 41, the connecting terminals 8, and the data lines 92 formed thereon so as to cover the source electrodes 3 and the drain electrodes 4.

At this time, in an area between the electrode fingers 3a and the electrode fingers 4a, there is formed a channel region 51.

The organic semiconductor layer 5 can be formed by, for example, coating (supplying) solution including an organic polymeric material or a precursor thereof on the substrate 2 using coating method so as to cover the source electrodes 3 and the drain electrodes 4, and then executing a post-process (e.g., heating, radiating with an infrared ray, or providing an ultrasonic ray) on the coating film according to need.

In thus arranging a plurality of thin film transistors 1 (elements) on the same substrate, by forming the organic semiconductor layer 5 separately for each element, the leak current and the cross talk between the elements can be prevented.

Note that, as a coating method, for example, a spin coating method, a casting method, a micro gravure coating method, a gravure coating method, a bar coating method, a roller coating method, a wire bar coating method, a dip coating method, a spray coating method, a screen printing method, a flexographic printing method, an offset printing method, an inkjet printing method, a micro-contact printing method, and so on can be cited, and one or more of these methods can be used alone or in combination.

Among these methods, the inkjet printing method is preferably used for forming the organic semiconductor layer 5. According to the inkjet printing method, the organic semiconductor layer 5 can selectively be formed so as to cover only the target regions, namely the source electrodes 3 and the drain electrodes 4, without providing the resist layer or the like to the pixel electrodes 41, the connecting terminals 8, and the data lines 92. Accordingly, the amount of the organic semiconductor material used therefor can be reduced, thus the manufacturing cost can be reduced.

Further, the area in which the organic semiconductor layer 5 is formed is not limited to the configuration shown in the drawings, and the organic semiconductor layer 5 can be formed only in the regions (the channel regions 51) between the electrode fingers 3a and the electrode fingers 4a. As described above, by using the inkjet method for forming the organic semiconductor layer for each of the elements independently, photo resist, chemical agents such as a developing liquid or a separating liquid, and a plasma process such as an oxygen plasma process or a $CF_4$ plasma process can be omitted. Therefore, alteration (e.g., doped with something) in the characteristics of the organic semiconductor material can surely be prevented.

In this case, as the solvent for dissolving the organic semiconductor material, for example, inorganic solvents such as nitric acid, sulfuric acid, ammonia, hydrogen peroxide, water, carbon disulfide, carbon tetrachloride, or ethylene carbonate, various organic solvents including ketones such as methyl ethyl ketone (MEK), acetone, diethyl ketone, methyl isopropyl ketone (MIPK), or cyclohexanon, alcohols solvents such as methanol, ethanol, isopropanol, ethylene glycol, diethylene glycol (DEG), or glycerine, ethers such as diethyl ether, diisopropyl ether, 1,2-dimetoxy ethane (DME), 1,4-dioxane, tetrahydrofuran (THF), tetrahydropyran (THP), anisole, diethylene glycol dimethyl ether (diglyme), or diethylene glycol ethyl ether (carbitol), Cellosolve™ solvents such as methyl cellosolve, ethyl cellosolve, or phenyl cellosolve, aliphatic hydrocarbons solvents such as hexane, pentane, heptane, or cyclohexane, aromatic hydrocarbons solvents such as toluene, xylene, or benzene, heteroaromatic solvents such as pyridine, pyrazine, furan, pyrrole, thiophene, or methylpyrrolidone, amide solvents such as N,N-dimethylformamide (DMF) or N, N-dimethylacetamide (DMA), halogenated compounds solvents such as dichloromethane, chloroform, or 1,2-dichloroethane, esters solvents such as ethyl acetate, methyl acetate, or ethyl formate, sulfur compounds solvents such as dimethyl sulfoxide (DMSO) or sulfolane, nitrile solvents such as acetonitrile, propionitrile, or acrylonitrile, organic acids solvents such as formic acid, acetic acid, trichloroacetic acid, or trifluoroacetic acid, or mixed solvents including the above can be used.

Since the organic semiconductor includes a conjugated system such as an aromatic hydrocarbon group or a heterocyclic group, it is generally easy to be dissolved with the aromatic hydrocarbons solvent. Toluene, xylene, trimethyl benzene, tetramethyl benzene, cyclohexyl benzene, and so on are particularly suitable solvents.

Step of Forming Gate Insulating Layer

Figure 4C:
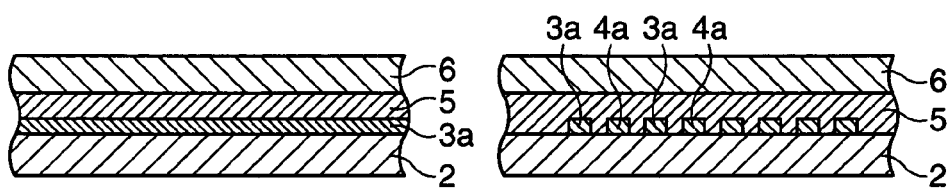

Subsequently, as shown in FIG. 4C, the gate insulating layer 6 is selectively formed so as to cover the organic semiconductor layer 5 and further the data lines 92 and the pixel electrodes 41 not shown, in other words, in a region excluding the connecting terminals 8 and the adjacent areas thereof (the periphery of the substrate 2).

The gate insulating layer 6 can be formed by coating (supplying) a solution including, for example, an organic polymeric material or a precursor thereof described above on the organic semiconductor layer 5 using coating method, and then executing a post-process (e.g., heating, irradiating with an infrared ray, or providing an ultrasonic waves) on the coating film according to need.

Further, the same method as described above can be used as the coating method. In the case in which the organic semiconductor layer 5 is composed of a soluble organic semiconductor material, a solvent, which does not swell nor dissolve the organic semiconductor layer 5 is preferably selected as the solvent for the insulating material. As described above, since the organic semiconductor material easily dissolves in aromatic carbon hydride solvents, they are preferably avoided in applying the insulating material. Namely, water like solvents, alcohols solvents, ketones solvents, ethers solvents, esters solvents, aliphatic hydrocarbons solvents, or fluorinated solvents are preferably used.

Note that, although the gate insulating layer 6 in the present embodiment has a configuration of covering the organic semiconductor layer 5, the pixel electrodes 41, and the data lines 92, the configuration is not so limited. The gate insulating layer 6 can selectively be formed on the organic semiconductor layer 5.

For forming the gate insulating layer 6, the spin-coating method is suitable for the former configuration, and the inkjet method is suitable for the latter configuration.

Step of Processing Gate Insulating Layer

Figure 4D:
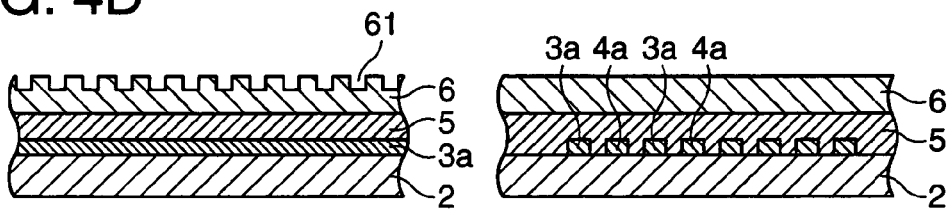

Subsequently, as shown in FIG. 4D, a plurality of grooves 61 is formed on the upper surface of the gate insulating layer 6 along a direction in which the gate electrodes are to be formed.

The shape of the groove 61 is not limited to one (a bracket shape) having a substantially constant width from the upper side of the gate insulating layer 6 toward the lower side as shown in FIG. 4D, but can be, for example, one (e.g., V-shaped or U-shaped) having a section where the width changes continuously or gradually, or can be an atypical form.

Note that the plurality of grooves 61 is enough to be provided to the areas on which the gate electrodes 7 are to be formed. For example, the plurality of grooves can be provided on substantially the whole surface of the upper side of the gate insulating layer 6, or can selectively be formed in areas each including and slightly larger than the area for forming the gate electrode 7.

Note that by forming the grooves 61 in substantially the whole surface of the upper side of the gate insulating layer 6, the step of positioning the gate insulating layer 6 with a device for forming the grooves 61 can be omitted, thus the manufacturing time of the active matrix device 10 can be reduced.

The grooves 61 described above can be formed using various methods. For example, a transfer method, a rubbing method, a softlithography method, a laser processing method, a blast method (a shot blast method, a sand blast method), and so on can be cited as the method. Among these methods, the transfer method or the rubbing method are preferably used. According to such a method, the grooves 61 can surely be formed with relative ease without using large-scale equipment.

In the transfer method here, for example, a mold having the inverse shape of the shape of the plurality of grooves 61 to be formed is provided, and the mold is pressed against the upper surface of the gate insulating layer 6 while applying heat if necessary.

As the composing material of the mold, one having greater strength than the gate insulating layer 6 is enough, and there is no other limitation thereto. For example, glass, quartz glass, silicon, nickel, and so on can be cited.

Further, if the mold made of nickel is used, for example, the mold can be obtained by forming a photo resist corresponding to the shape of the grooves 61 on a glass substrate, and then forming (electroforming) a Ni thick film on the patterned indented surface by an electrolytic plating process or an electroless plating process, and further separating the photo resist therefrom.

In the rubbing method, for example, a roller wrapped around with a cloth having patterned microscopic bumps is rotated while pressed against the upper surface of the gate insulating layer 6.

Further, a softlithography method is particularly effective for forming the grooves 61 with finer shapes. In the softlithography method here, the surface of the gate insulating layer 6 is scratched with probes (stylets) equipped to a scanning probe microscope (SPM) such as a scanning tunneling microscope (STM) or an atomic force microscope (AFM).

Note that, if the grooves 61 are formed by the methods described above, it is particularly effective to form the gate insulating layer 6 using the organic polymeric materials described above as the main composing material. Namely, since the gate insulating layer 6 composed principally of the organic polymeric materials is easy to be reprocessed after once formed, the formation of the grooves 61 using the transfer method or the rubbing method can more surely be carried out.

Further, in the case in which the gate insulating layer 6 is formed of indurative resin of various types such as phenol resin, epoxy resin, or xylene resin, the gate insulating layer 6 having the grooves 61 formed thereon can be obtained by providing a hardening process such as heating or ultraviolet irradiation while pressing the mold used for the transfer method against the upper surface of the coating film formed in the step 4. In this case, the step 4 and the step 5 can advantageously be executed in a single step.

Step of Forming Wiring (Gate Electrodes)

Figure 4E:
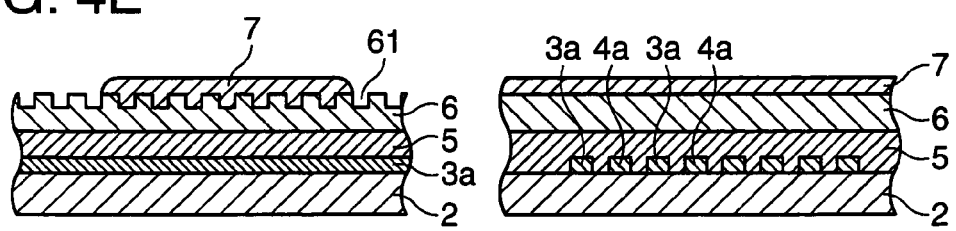

Subsequently, as shown in FIG. 4E, gate line 91 (the gate electrode 7) is formed on the gate insulating layer 6 in an area corresponding to the area between the source electrode 3 and the drain electrode 4.

In the present embodiment, the gate electrodes 7 of the thin film transistors 1 arranged in a line are formed integrally. Thus, the gate electrodes 7 adjacent to each other are connected substantially in line. The gate electrodes 7 formed integrally and substantially in line, namely a common electrode shaped like a substantial line forms the gate line 91.

The gate line 91, as described above, can be formed by sequentially supplying droplets of a liquid material including an electrically conductive material or a precursor thereof on the gate insulating layer 6 in line so that the droplets are linked with each other to form a coating film, and then according to needs, providing a post-process (e.g., heating, infrared irradiation, or application with ultrasonic waves) on the coating film.

In the present embodiment, prior to the step 6, a plurality of grooves 61 is formed (See the step 5.) on the upper surface of the gate insulating layer 6 along the direction in which the gate electrodes 7 (the gate line 91) is formed.

Here, on the condition that the grooves 61 are not formed on the upper surface of the gate insulating layer 6, since the gate insulating layer 6 is typically formed of a material not absorbing the droplets, the droplet landing on the surface of the gate insulating layer 6 simultaneously extends isotropically while wetting the surface. Therefore, the width of the gate electrodes 7 thus formed typically becomes larger than the diameter of the droplet as landing.

On the contrary, in the present embodiment of the invention, prior to forming the gate electrodes 7, as shown in FIG. 5A, a plurality of grooves 61 is formed along the direction in which the gate electrodes 7 are formed. Therefore, the droplet supplied (provided) on the upper surface of the gate insulating layer 6 is absorbed inside the grooves 61 by the capillary phenomenon or a geometric influence of wettability when abutting (landing) on the surface as shown in FIG. 5B. Namely, the droplet extends along the grooves 61 with priority. Thus, the droplet can be prevented from extending in the width direction of the grooves 61.

As a result, as shown in FIG. 5C, the droplet supplied on the upper surface of the gate insulating layer 6 maintains or even reduces its size as landing thereon in the width direction of the grooves 61 to form a shape elongated along the grooves 61.

As described above, according to the invention, the gate electrodes 7 having anisotropy along an aiming direction can surely be formed. Further, since the width $\omega$ is the same as or even smaller than the diameter of the droplet as landing thereon, the gate electrodes 7 having widths smaller than the width of a gate electrode, which have been able to be formed using the inkjet method in the past.

Note that, by reducing the wettability of the upper surface of the gate insulating layer 6 with the droplet, the droplet extends along the grooves 61 while shrinking in the width direction, thus the gate electrodes 7 having a further smaller width (a width smaller than the diameter of the droplet as landing thereon) can be formed.

Further, as shown in the drawings, by reducing the widths of the grooves and the distances (pitch) between the grooves to form a configuration in which the droplet lands thereon so as to traverse a number of grooves 61, greater capillary force (driving force) can be obtained. Thus, the gate electrodes 7 with further finer widths can be formed.

Such grooves 61 and the droplet preferably satisfy the following relationship. Namely, assuming that the distance between the grooves 61 is A [nm], and the diameter of the droplet as landing is B [nm], the relationship that B/A is in a range of about 3 through $3 \times 10^5$ is preferably satisfied and the relationship that B/A is in a range of about 30 through $1.5 \times 10^4$ is further preferably satisfied. Thus, the gate electrodes 7 with further finer widths can surely be formed.

Note that the depths of the grooves 61 are preferably in a range of about 0.1 through 1000 nm, and more preferably in a range of about 0.2 through 300 nm, and further more preferably in a range of about 10 through 200 nm.

The gate electrodes 7 thus formed can precisely be formed along the aiming direction and have particularly small widths $\omega$. Accordingly, the area of sections where the source electrodes 3 or the drain electrodes 4 uselessly overlap the gate electrodes 7 can be reduced, in other words, the regions uncontrollable by electric fields applied from the gate electrodes 7 can be reduced, thus increase in the off current of the thin film transistors 1 can surely be prevented or suppressed. As a result, the thin film transistors 1 exert preferable performances (switching characteristics).

Further, although the distances between some of the grooves 61 can be different, the distances between the grooves 61 are preferably similar to each other as shown in the drawings. Thus, variation in the extending condition (an amount of extension) in the width direction of the grooves 61 depending on the positions the droplets are supplied to can be prevented. Therefore, the gate electrodes 7 can be formed further straight.

The liquid material (hereinafter referred to as ink) used for forming the gate line 91 (the gate electrodes 7) will be described.

The viscosity (at room temperature) of the ink is not particularly limited, but is preferably in a range of about 3 through 10 cps, in general, and more preferably in a range of about 4 through 8 cps. By arranging the viscosity of the ink in the range mentioned above, the droplets can more stably be ejected from the nozzle.

Further, the volume (in average) of an ink droplet is not particularly limited, but is preferably in a range of about 0.1 through 40 pL in general, and further preferably in a range of about 1 through 30 pL. By setting the amount (in average) of one droplet to be the range mentioned above, the landing diameter of the droplet supplied on the gate insulating layer 6 becomes small, thus the gate line 91 (the gate electrodes 7) having a small width ω can be formed.

Materials as described in A through D below, for example, can be used for the ink.

In the case in which the gate electrode 91 is composed of an electrically conductive polymeric material, a solution dissolving the electrically conductive polymeric material is used as the ink.

In this case, the same solvent as cited with regard to the step 3 can be used therefor.

If the gate line 91 is composed of an inorganic material, a dispersion liquid including particles of the inorganic material (metallic particles) can be used as the ink.

In particular, those composed mainly of Ag are preferable for the particles of the inorganic material (metallic particles). By using such particles composed mainly of Ag, the ink can easily be prepared, and further, high conductivity can be obtained in the resulting gate line 91.

In this case, the content of the particles of the inorganic material in the ink is not particularly limited, but is preferably in a range of about 1 through 40 wt %, and further preferably in a range of about 10 through 30 wt %.

Further, the average particle diameter of the inorganic material particles in use is not particularly limited, but is preferably in a range about 1 through 100 nm, and is further preferably in a range of about 2 through 30 nm.

Further, particles coated with a coagulation inhibition agent (a dispersing agent) for inhibiting coagulation in room temperature are preferably used for the inorganic material particles. As the coagulation inhibition agent, for example, compounds having a group including a nitrogen atom such as alkylamine, compounds having a group including an oxygen atom such as alkanediol, and compounds having a group including a sulfur atom such as alkylthiol or alkanethiol can be cited.

In this case, a remover capable of removing the coagulation inhibition agent by a predetermined process (e.g., heating or the like) is added into the ink. As the remover, for example, various carbonic acid including straight type or branched type of saturated carbonic acids with carbon number of 1 through 10 such as formic acid, acetic acid, proponic acid, butanoic acid, hexanoic acid, or octylic acid, unsaturated carbonic acids such as acrylic acid, methacrylic acid, crotonic acid, cinnamic acid, benzoic acid, or sorbic acid, dibasic acids such as oxalic acid, malonic acid, sebacic acid, maleic acid, fumaric acid, or itaconic acid, organic acids including various phosphoric acids and various sulfonic acids substituting the carboxyl groups of the above carbonic acids with phosphate groups or sulfonyl groups, esters derived from the above organic acids, aromatic acid anhydrides such as phthalic anhydride, trimellitic anhydride, pyromellitic dianhydride, benzophenone tetracarboxylic dianhydride, ethylene glycol bis (anhydro trimelitate), or glycerol tris (anhydro trimelitate), cyclic fatty acid anhydrides such as maleic anhydride, succinic anhydride, tetrahydrophtharic anhydride, methyltetrahydrophtharic anhydride, methyl nadic anhydride, alkenyl succinic anhydride, hexahydro phthalic anhydride, methylhexahydro phthalic anhydride, or methylsyclohexene tetracarboxylic dianhydride, fatty acid anhydrides such as polyadipic anhydride, polyazelaic anhydride, or polysebacic anhydride can be cited.

As the dispersion medium, for example, terpineol, mineral spirit, xylene, toluene, ethyl benzene, mesitylene, hexane, heptane, octane, decane, dodecane, cyclohexane, cyclooctane, ethanol, isopropanol (IPA), water, or a mixed liquid including the above can be used.

Further, precursors of various thermoset resins such as phenol resin, epoxy resin, unsaturated polyester resin, vinylester resin, diallyl phthalate resin, oligoester acrylate resin, xylene resin, bismaleimide triazine resin, furan resin, urea resin, polyurethane resin, melamine resin, silicone resin can be added into (mixed with) the ink.

Note that the viscosity of the ink can be controlled by, for example, arranging the content of the inorganic material particles, the nature or the composition of the dispersion medium, or presence or absence or the nature of the additives.

In the case of forming the gate line 91 with a metallic material, dispersion liquid including a reducing agent and metal oxide particles composed of metal oxide that becomes a metal material by being reduced can be used as the ink.

In this case, the content of the particles of the metal oxide in the ink is not particularly limited, but is preferably in a range of about 1 through 40 wt %, and further preferably in a range of about 10 through 30 wt %.

Further, the average particle diameter of the metal oxide particles is not particularly limited, but is preferably no greater than 100 nm, and is further preferably no greater than 30 nm.

Further, as the reducing agent, for example, ascorbic acid, hydrogen sulfide, oxalic acid, and carbon monoxide can be cited.

As the dispersion medium, for example, low viscosity oils such as butyl cellosolve or polyethylene glycol, alcohols such as 2-propanol, or a compound liquid including the above can be used.

Note that the viscosity of the ink can be controlled by, for example, arranging the content of the metal oxide particles, the nature or the composition of the dispersion medium.

If the gate line 91 is composed of metal oxide, a solution including the precursor of the metal oxide can be used as the ink.

As the precursor of the metal oxide to be used, for example, organic metallic compounds such as metal alkoxide or metallic salt of acetic acid or acetic acid derivatives, inorganic metallic compounds such as a metallic chloride, a metallic sulfide, or a metallic cyanide can be cited, and one or more of these precursors can be used alone or in combination.

The concentration (content) of the precursor of the metal oxide in the ink is not particularly limited, but is preferably in a range of about 1 through 50 wt %, and further preferably in a range of about 10 through 30 wt %.

Further, as the solvent, for example, water, polyhydric alcohols such as ethylene glycol, glycerine, diethylene glycol, or triethanolamine, or monoalcohols such as methanol, ethanol, isopropanol, butanol, allyl alcohol, furfuryl alcohol, ethylene glycol monoacetate, or a compound liquid including the above can be used.

Note that the viscosity of the ink can be controlled by, for example, arranging the concentration of the precursor of the metal oxide, the nature or the composition of the solvent.

After going through the steps described above, the active matrix device 10 (a semiconductor device according to the invention) shown in FIG. 1 can be obtained.

Note that, although in the present embodiment, the case in which the grooves 61 is formed on the upper surface of the gate insulating layer 6 as a physical process is explained, the process is not so limited. Namely, as the physical process, for example, a process of providing a number of oblong protrusions on the upper surface of the gate insulating layer 6 along the direction in which the droplet is extended can be adopted.

Second Embodiment

An active matrix device and its manufacturing method of a second embodiment will now be explained.

Figure 6A:
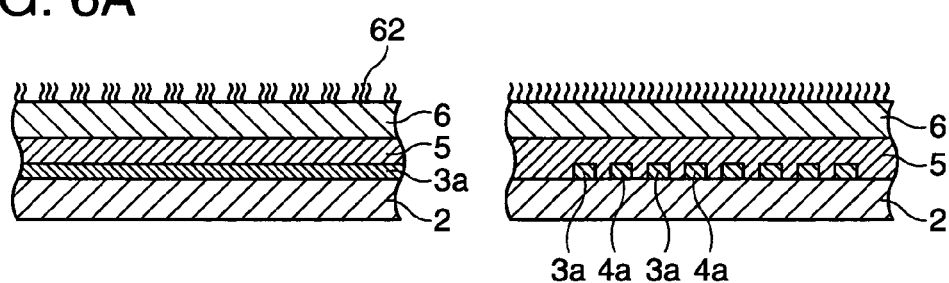
FIGS. 6A and 6B are vertical cross-sectional views for explaining a method of forming the thin film transistor implemented in the active matrix device of the second embodiment.
Figure 6B:
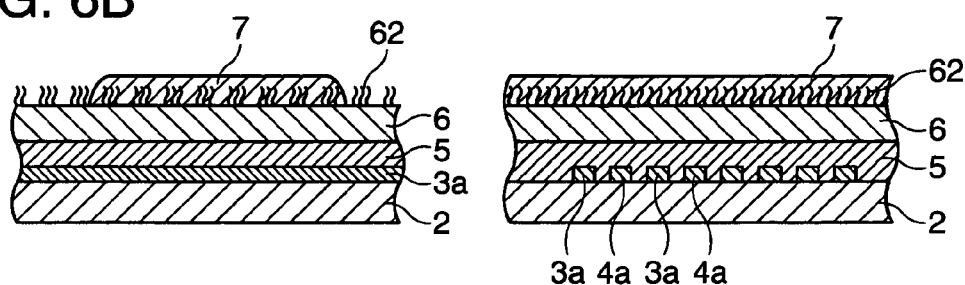

Each of FIGS. 6A and 6B is a vertical cross-sectional view for explaining a process of forming a thin film transistor implemented in the active matrix of the second embodiment, where one along the A-A line in FIG. 2A is shown in the left and one along the B-B line in FIG. 2A is shown in the right, respectively. Note that the upper side of FIGS. 6A and 6B is referred to as "upper side" and the lower side thereof is referred to as "lower side" in the following descriptions.

Hereinafter, the second embodiment is described with a focus mainly on the differences from the first embodiment described above, and the descriptions regarding the common matters are omitted.

The second embodiment is different from the first embodiment in the point that a chemical process is provided instead of the physical process on the upper surface of the gate insulating layer 6 in step 5 (the step of processing the gate insulating layer), and is the same as the first embodiment except this point.

Hereinafter, the chemical process will be described.

In the present embodiment, as the chemical process, a plurality of strip-shaped lyophobic films 62 is formed on the upper surface of the gate insulating layer 6 along the direction in which the gate electrodes 7 are to be formed as shown in FIG. 6A.

Namely, in the present embodiment, regions (first regions) provided with the lyophobic films 62 form a lyophobic section having lower wettability with the droplets than regions (second regions) not provided with the lyophobic films 62, and the second regions form a lyophilic section having higher wettability with the droplets than the first regions.

By providing such a chemical process, the same function and the same advantage can be obtained as the case with the physical process.

Further, as shown in the drawings, by reducing the widths of the lyophobic films 62 (the first regions) and the distances (the widths of the second regions) between the lyophobic films 62 to form a configuration in which the droplet lands thereon so as to traverse a number of lyophobic films 62, the droplet can surely be prevented from extending for wetting in the width direction of the lyophobic films 62 and correctly extends in the aiming direction. Thus, the gate electrodes 7 with further finer widths can be formed.

Such lyophobic films 62 and the droplet preferably satisfy the following relationship. Namely, assuming that the distance between the lyophobic films 62 is C [nm], and the diameter of the droplet as landing is D [nm], the relationship that D/C is in a range of about 3 through $3 \times 10^5$ is preferably satisfied and the relationship that D/C is in a range of about 30 through $1.5 \times 10^4$ is further preferably satisfied. Thus, the gate electrodes 7 with further finer widths can surely be formed.

Further, although the distances between some of the lyophobic films 62 can be different, the distances between the lyophobic films 62 are preferably similar to each other as shown in the drawings. Thus, variation in the extending condition (an amount of extension) in the width direction of the grooves 61 depending on the positions the droplets are supplied to can be prevented. Therefore, the gate electrodes 7 can be formed further straight.

Further, as is the case with the grooves 61 in the first embodiment described above, the plurality of lyophobic films 62 is also enough to be provided to the areas on which the gate electrodes 7 are to be formed. For example, the plurality of lyophobic films can be provided on substantially the whole surface of the upper side of the gate insulating layer 6, or can selectively be formed in areas each including and slightly larger than the area for forming the gate electrode 7.

Such lyophobic films 62 can be formed by, for example, supplying a liquid material for forming the lyophobic films, and then drying according to needs.

The lyophobic films 62 can be formed by forming a lyophobic layer covering the entire process area and then removing unnecessary sections, or can selectively be formed in the target areas.

As the method of forming the lyophobic films 62 by removing unnecessary parts of the lyophobic layer formed to cover the entire process area, the following can be cited: 1. mechanically removing the unnecessary parts using the rubbing method described above; 2. irradiating the unnecessary parts with an active energy beam such as an ultraviolet beam under reduced pressure; 3. providing a mold having protrusions corresponding to the pattern of the unnecessary parts and pressing the mold provided with an adhesive on the protrusions against the unnecessary parts.

Further, as the method of selectively forming the lyophobic films 62 in the areas (the lyophobic film forming areas) in which the lyophobic films 62 are to be formed, for example, the following methods can be cited: 1. providing a mold having protrusions corresponding to the lyophobic film forming areas and pressing the mold impregnated with the lyophobic film forming material in the protrusions against the lyophobic film forming areas; 2. forming a resist layer having openings corresponding to the lyophobic film forming areas using a photolithography process and removing the resist layer after supplying the openings with the lyophobic film forming material; 3. supplying the lyophobic film forming areas with the lyophobic film forming material guided by a probe (stylet) used as a nib and equipped to a scanning probe microscope (SPM) used in the softlithography method described above.

As the composing material of the lyophobic films 62, for example, a coupling agent having a functional group presenting lyophobicity, a lyophobic resin material, and so on can be cited. The coupling agent among these items is preferably used. According to the coupling agent, the fine lyophobic films 62 can be formed with relative ease.

Further, as the lyophobic film forming material, a solution or a dispersion liquid confected by mixing the above materials with a solvent or a dispersion medium can be used.

As the coupling agent, for example, a silane coupling agent, a titantate coupling agent, an aluminate coupling agent, a zirconate coupling agent, an organic phosphate coupling agent, a silyl peroxide coupling agent, or the like can be used.

As the functional group presenting lyophobicity, for example, a fluoroalkyl group, an alkyl group, a vinyl group, an epoxy group, a styryl group, a methacryloxy group, and so on can be cited.

As a specific example of the coupling agent, (tridecafluoro-1,1,2,2 tetrahydrooctyl)triethoxysilane, (tridecafluoro-1,1,2, 2 tetrahydrooctyl)trimethoxysilane, (tridecafluoro-1,1,2,2 tetrahydrooctyl)trichlorosilane, octadecyltrimethoxysilane, vinyltrimethoxysilane, and so on can be cited.

Meanwhile, as the lyophobic resin material, for example, fluorocarbon resin such as polytetrafluoroethylene (PTFE), tetrafluoroehtylene-perfluoroalkylvinylether copolymers (PFA), ethylene-tetrafluoroethylene copolymer (ETFE), perfluoroethylene-propen copolymer (FEP), ethylene-chlorotrifluoroethylene copolymer (ECTFE), and so on can be cited.

As the solvent or the dispersion medium, the same matters as explained with respect to the step 3 can be used.

Further, the gate insulating layer 6 is preferably composed principally of an organic material (in particular an organic polymeric material) as is the case with the physical process. Since the gate insulating layer 6 composed mainly of an organic polymeric material has excellent adhesiveness with the composing material of the lyophobic films 62 described above, the lyophobic films 62 can easily and surely be formed on the upper surface of the gate insulating layer 6.

Note that, if the upper surface of the gate insulating layer 6 is composed of a material presenting relatively low wetting property to the droplet, it is advisable that the lyophobic films 62 are formed in the lyophobic film forming areas after executing a lyophilicity providing process on the entire process area. Thus, the difference in the wetting property to the droplet between the lyophobic section and the lyophilic section certainly becomes large. As the lyophilicity providing process mentioned above, for example, a method of irradiating the upper surface of the gate insulating layer 6 with an ultraviolet beam or an infrared beam under an oxygen environment, or a method of irradiating it with oxygen plasma can be cited.

Further, although the case in which the lyophobic section is formed by providing the lyophobic films 62 is described in the present embodiment, the lyophobic section can be formed by injecting (implanting) ions such as fluorine ions capable of providing lyophobicity to the areas for forming the lyophobic section.

Further, although the case in which the lyophobic section (the lyophobic films 62) and the lyophilic section (the areas not provided with the lyophobic films 62) are alternately provided is explained in the present embodiment, the invention is not limited to such a configuration. Namely, the lyophobic section and the lyophilic section can also be configured, for example, as follows: 1. a number of lyophobic sections having different levels of lyophobicity are provided between a pair of lyophilic sections formed along the extending direction of the droplet; 2. a number of lyophilic sections having different levels of lyophilicity are provided between a pair of lyophobic sections formed along the extending direction of the droplet; and 3. a combination of the above two configurations 1 and 2. With these configurations, the same function and the same advantage as described above can be obtained.

In the active matrix device 10 as described above, since the data line 92 is formed so that the width ω of the data line 92 is equal to or smaller than the diameter of the droplet as landing, increase in the off current of the thin film transistor 1 can preferably be suppressed of prevented. Further, if a display device equipped with the active matrix device 10 described below is manufactured, the aperture ratio and display quality of the display device can surely be prevented from deteriorating because the data line 92 is formed to have the small width ω to increase the area for forming the pixel electrodes 41.

Note that the upper surface of the gate insulating layer 6 can be provided with a process combining the physical process explained with respect to the first embodiment and the chemical process explained with respect to the second embodiment.

As such a process, for example, the following can be cited: 1. forming the grooves 61 using the process presented in the first embodiment section, and contacting a pad or a stamper impregnated with the lyophobic film forming material used in the second embodiment to the upper surface of the gate insulating layer 6 provided with the grooves 61, thereby forming the lyophobic films 62 in the areas between the grooves 61; 2. forming a lyophobic layer on the entire upper surface of the gate insulating layer 6 using the process presented in the second embodiment section, and then removing unnecessary parts of the lyophobic layer and parts of the insulating layer 6 abutting on the unnecessary parts together using the rubbing method or the softlithography method presented in the first embodiment section, thereby forming the grooves 61; 3. forming a lyophobic layer on the entire upper surface of the gate insulating layer 6 using the process presented in the second embodiment section, and then forming the grooves 61 using the transfer method presented in the first embodiment section.

Here, according to the process 1 or the process 2, the lyophobic films 62 can selectively be formed in the areas between the grooves 61. Further, according to the process 3, the lyophobic films 62 can be formed in the areas between the grooves 61 and the bottom of the grooves 61, and in addition, the gate insulating layer 6 can be exposed from a part of the side surfaces of the grooves 61.

Therefore, according to the above processes, the wetting property of at least a part of the inside surfaces of the grooves 61 to the droplet can be made higher than that of the areas between the grooves 61. As a result, the function and the advantage obtained by providing the physical process or the chemical process can be exerted more remarkably.

Display Device

Hereinafter, the display device according to the invention equipped with the active matrix device 10 will be explained taking an electrophoretic display device as an example.

Figure 7:
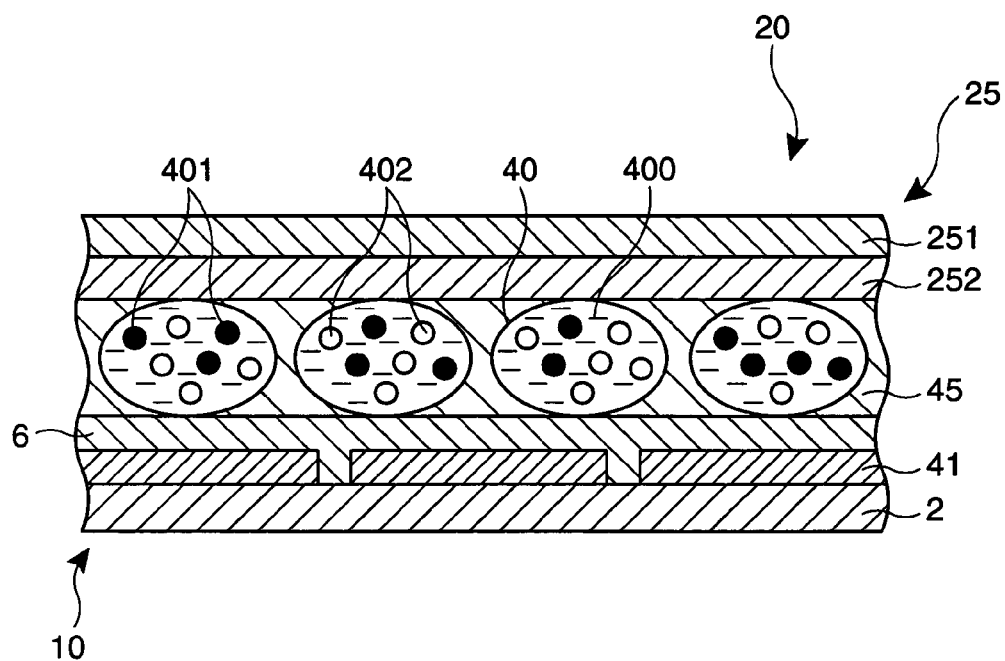
FIG. 7 is a vertical cross-sectional view showing an embodiment of applying an active matrix device according to the present invention to an electrophoretic display device.

FIG. 7 is a vertical cross-sectional view showing an embodiment in which the display device according to the invention is applied as an electrophoretic display device.

The electrophoretic display device 20 shown in FIG. 7 is composed of the active matrix device 10 and an electrophoretic display section 25 provided on the active matrix device 10.

As shown in FIG. 7, the electrophoretic display section 25 includes an opposing substrate 251, an opposing electrode 252, microcapsules 40, and a binder member 45.

The opposing electrode 252 is stacked on the opposing substrate 251, and the microcapsules 40 (display medium) are fixed on the opposing electrode 252 by the binder member 45.

And, the electrophoretic display section 25 is joined with the active matrix device 10 so that the microcapsules 40 abut on the gate insulating layer 6.

Further, in each of the capsules 40, electrophoretic dispersion liquid 400 including plural kinds of electrophoretic particles having different characteristics from each other, two kinds of electrophoretic particles 401 and 402 having different charges and colors (hues) in the present embodiment, is encapsulated.

Note that as described above, the pixel electrodes 41 implemented in the active matrix device 10, which are divided in a matrix, namely so as to be arranged regularly in both vertical and horizontal directions, are connected to the drain electrodes 4 provided to the thin film transistors 1 and further covered by the gate insulating layer 6.

Further, terminals of a drive IC are connected to the connecting terminals 8 (terminals 81, 82) provided to the active matrix device 10, thus enabling on/off switching of the thin film transistors 1 (switching elements) provided to the active matrix device 10.

Namely, in the electrophoretic display device 20 as described above, if one or more of the gate lines 91 are supplied with selection signals (selection voltages), the thin film transistors 1 connected to the gate lines 91 supplied with the selection signals (selection voltages) are switched on.

Thus, the data lines 92 connected to these thin film transistors 1 and the pixel electrodes 41 are substantially electrically connected. In this case, if the desired data (voltages) are supplied to the data lines 92, the data (voltages) are then supplied to the pixel electrodes 41.

Then, an electric field is generated between the pixel electrode 41 and the opposing electrode 252, and the electrophoretic particles 401 and 402 are electrophoresed toward either of the electrodes in accordance with the direction and strength of the electric field, the characteristics of the electrophoretic particles 401 and 402, and so on.

Meanwhile, in this state, when the supply of the selection signals (selection voltages) to the gate lines 91 are stopped, the thin film transistors 1 are switched off bringing the data lines 92 and the pixel electrodes 41 connected to the thin film transistors 1 into electrically disconnected states.

Therefore, by executing supplying or stopping the selection signals to the gate lines 91 and supplying or stopping the data to the data lines 92 in combination, desired images (information) can be displayed on the display surface side (the opposing substrate) of the electrophoretic display device 20.

In particular, in the electrophoretic display device 20 according to the present embodiment, the electrophoretic particles 401 and 402 are differently colored, thus enabling images with multiple grayscales to be displayed.

Further, since the electrophoretic display device 20 according to the present embodiment is equipped with the active matrix device 10 according to the invention, the thin film transistor 1 connected to a specific gate line 91 can selectively be switched on/off, thus the problem of cross-talk is difficult to arise, and further, the faster circuit operation is possible, which can provide high quality images (information).

Further, since the electrophoretic display device 20 according to the present embodiment can operate with low drive voltages, lower power consumption can be realized.

Note that, although the electrophoretic display device 20 according to the present embodiment has a configuration in which a number of microcapsules 40 encapsulating the electrophoretic dispersion liquid 400 are placed between the pixel electrodes 41 and the opposing electrode 252, the electrophoretic display device 20 can have a configuration in which the electrophoretic dispersion liquid 400 is encapsulated by each of a number of spaces (cells) partitioned by partition walls. Even in the electrophoretic display device 20 thus configured, the function and the advantage as described above are preferably exerted.

Note that the display device according to the present invention is not limited to the application as the electrophoretic display device 20 as described above, but can also be applied as liquid crystal display devices, organic or inorganic EL display devices and so on.

Electronic Instrument

The electrophoretic display device 20 as described above can be installed in various electronic instruments. The electronic instrument according to an embodiment of the present invention equipped with the electrophoretic display device 20 is hereinafter described.

Electronic Paper

Firstly, an embodiment of applying the electronic instrument according to the present invention as the electronic paper is explained.

Figure 8:
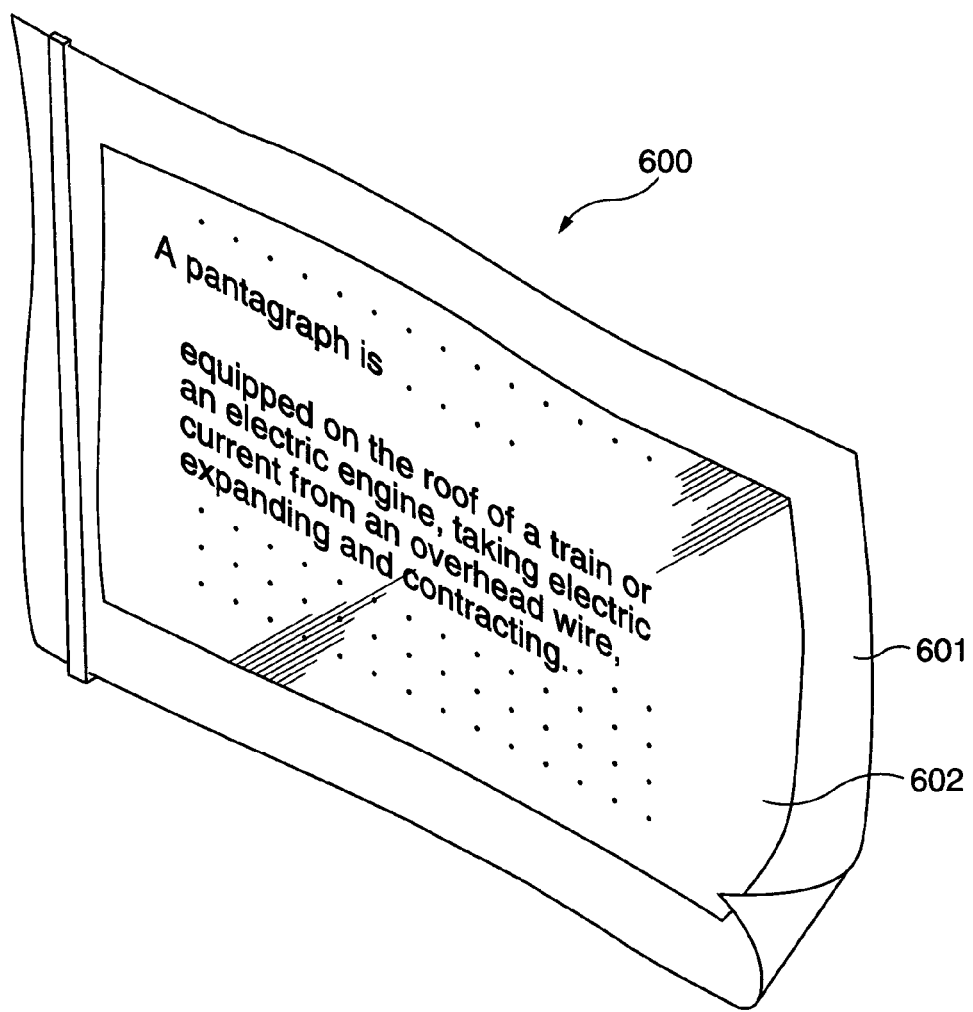
FIG. 8 is a perspective view showing an embodiment of applying the display device according to the present invention to an electronic paper.

FIG. 8 is a perspective view showing the embodiment of applying the electronic instrument of the invention as the electronic paper.

The electronic paper 600 shown in this drawing is equipped with a main body 601 composed of a rewritable sheet offering the same feeling of quality and having the same flexibility as paper and a display unit 602.

In the electronic paper 600 as described above, the display unit 602 is composed of the electrophoretic display device 20 as described above.

Display

Then, an embodiment of applying the electronic instrument of the invention as a display is explained.

Figure 9A:
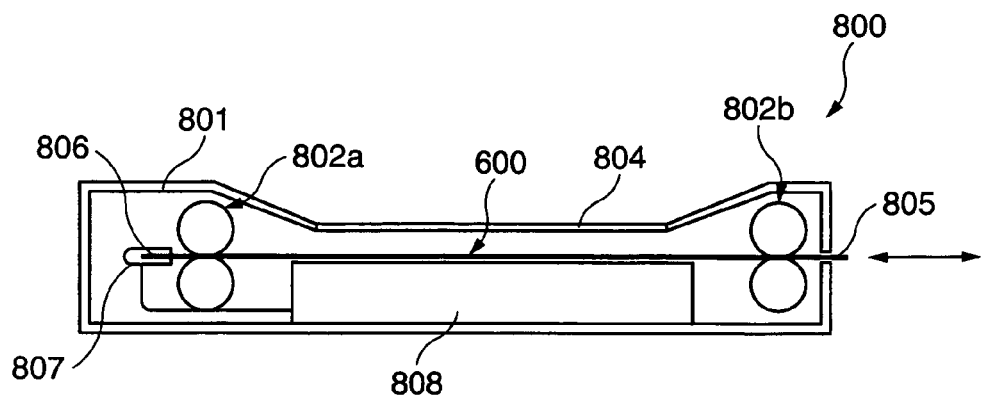
FIGS. 9A and 9B are schematic views showing an embodiment of applying the display device according to the invention as a display section.
Figure 9B:
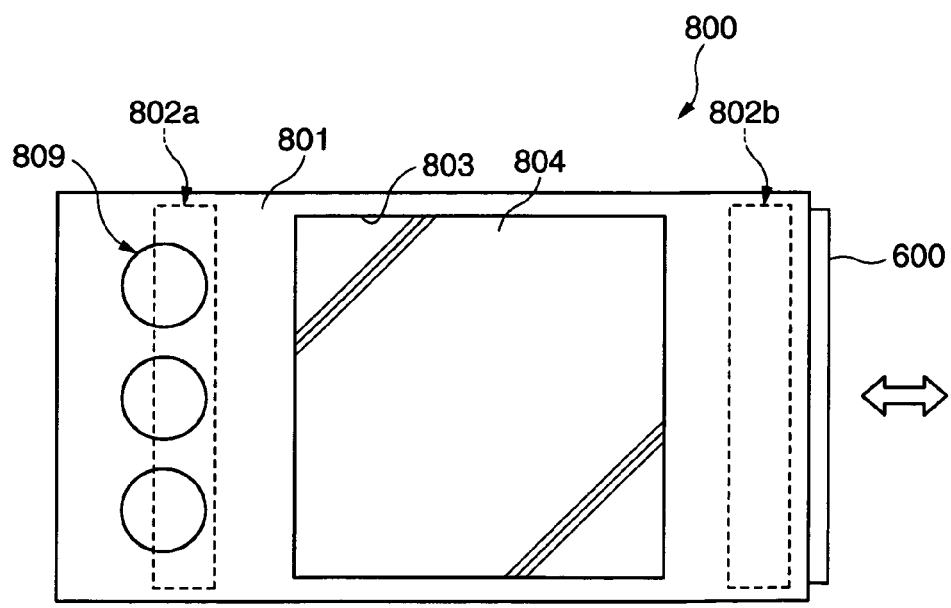

FIGS. 9A and 9B are views showing the embodiment of applying the electronic instrument of the invention as the display, where FIG. 9A is a cross-sectional view, and FIG. 9B is a plan view.

The display 800 shown in the drawings is composed of a main body 801 and the electronic paper 600 detachably mounted on the main body 801. Note that the configuration of the electronic paper 600 is as described above, namely the same as the configuration shown in FIG. 8.

The main body 801 is provided with an inlet 805 at a side thereof (right side of the figure) through which the electronic paper 600 can be inserted, and with two pairs of feed rollers 802a and 802b inside thereof. When the electronic paper 600 is inserted in the main body 801 through the inlet 805, the electronic paper 600 is positioned in the main body 801 while being held by the pairs of feed rollers 802a and 802b.

Further, in the display side (the near side of the paper in FIG. 9B) of the main body 801, there is formed a rectangular hollow section 803, in which a transparent glass plate 804 is engaged. Thus, the electronic paper 600 inserted and positioned in the main body 801 can be seen from outside the main body 801. Namely, in the display 800, the display surface is realized by making the electronic paper 600 positioned in the main body 801 be seen through the transparent glass plate 804.

Further, a terminal section 806 is provided on the tip portion of the electronic paper 600 in the inserting direction (left side in the drawing), and a socket 807 is provided inside the main body 801, to which the terminal section 806 is connected when the electronic paper 600 is positioned in the main body 801. The socket 807 is electrically connected to a controller 808 and an operation section 809.

In the display 800, the electronic paper 600, which is detachably mounted on the main body 801, can also be carried and used while being detached from the main body 801.

Further, in the display 800 described above, the electronic paper 600 is composed of the electrophoretic display device 20 as described above.

Note that the application of the electronic instrument according to the invention is not limited to those described above, but includes, for example, a television, a video cassette recorder of either a view-finder type or a direct view type, a car navigation system, a pager, a personal digital assistance, an electronic calculator, an electronic newspaper, a word processor, a personal computer, a workstation, a picture phone, a POS terminal, devices equipped with touch panels, and the electrophoretic display device 20 can be applied to display sections of the above various electronic instruments.

Although the descriptions regarding the method of manufacturing a semiconductor device, the semiconductor, the display device, and the electronic instrument according to the invention are given as the above, the invention is not limited to the above.

For example, although the thin film transistor is described using the top-gate structure type as an example in the embodiment, the method of manufacturing a semiconductor device according to the invention can also be applied to those having the bottom-gate structures.

Further, although in the present embodiments, the description reads that the physical process or the chemical process is applied to the upper surface of the substrate (the gate insulating layer 6) substantially in line to obtain the linear film (the data line), in case the shape of the film includes a circle or curved sections, the physical process or the chemical process can be applied on the surface of the substrate to which the film is to be formed in accordance with the shape of the film.

Further, although in the present embodiments, the case in which the gate line of the active matrix device (the semiconductor device of the invention) is formed is explained as an example, the invention is not limited to this case, but can be applied to the case in which a filter section of a color filter is formed or the case in which wiring section of a radio frequency (RF) identification is formed.

Further, in the manufacturing method of the semiconductor device according to the present invention, one or more of steps of desired purposes can be added if necessary.

Further, the configuration of each section of the semiconductor device, the display device, and the electronic instrument can be replaced with a desired configuration capable of comparably functioning thereto or added with a desired configuration.

SPECIFIC EXAMPLES

Specific examples according to the invention will hereinafter be described.

In the following examples, purified water is used as water unless otherwise stated.

Specific Example 1

Firstly, a glass substrate with a thickness of 1 mm is provided, and washed with water (cleaning liquid).

Then, the glass substrate is dipped in an aqueous solution (25° C.) of distearyldimethylammonium chloride (cationic surface-active agent) for 60 seconds. Thus, distearyldimethylammonium chloride is absorbed on the surface of the glass substrate. Subsequently, the glass substrate is cleaned with water.

Then, the glass substrate is dipped in a Sn—Pd colloidal suspension (25° C.) for 60 seconds. Thus, Sn—Pd is absorbed on the surface of the glass substrate. Subsequently, the glass substrate is cleaned with water.

Then, the glass substrate is dipped in an aqueous solution (25° C.) including $HBF_4$ and glucose for 60 seconds. Thus, Sn is removed from the surface of the glass substrate to expose Pd on the surface of the glass substrate. Subsequently, the glass substrate is cleaned with water.

Subsequently, the glass substrate is dipped in a Ni plating solution (80° C., pH 8.5) for 60 seconds. Thus, a Ni plating film with a thickness of 100 nm is formed on the surface of the glass substrate.

Note that the Ni plating solution is prepared by dissolving 10 g of nickel sulfate, 100 g of hydrazine (a reducing agent), and 5 g of ammonium sulfide (a pH adjuster) with IL of water.

And then, a resist layer patterned correspondingly to the shapes of the source electrodes, the drain electrodes, the pixel electrodes, the connecting terminals, and the data lines is formed on the Ni plating film using a photolithography process.

Note that "OPR800" produced by Tokyo Ohka Kogyo Co. Ltd. is used as the resist material.

Subsequently, the glass substrate is dipped in an aqueous solution (25° C.) of iron chloride. Thus, a part of the plating film not covered by the resist layer is removed to form the source electrodes, the drain electrodes, the pixel electrodes, the connecting terminals, and the data lines.

Note that each of the source electrodes and each of the drain electrodes shape like comb teeth, and are formed so as to engage with each other. Further, the distance (the channel length L) between the source electrode fingers and the drain electrode fingers is set to 10 μm, and the distance between a base end of the source electrode fingers and a base end of the drain electrode fingers is set to 20 μm.

Subsequently, after removing the resist layer using the resist remover, the glass substrate with the above section formed thereon is sequentially washed with water and methanol.

And then, the oxygen plasma process (the atmospheric pressure oxygen plasma process) is executed on the substrate with the above sections formed thereon under the atmospheric pressure.

Note that, in the conditions of the atmospheric pressure plasma process, the RF power is set to 0.05 $W/cm^2$ and the gas flow rate is set to 80 sccm.

Subsequently, a 1.5% (wt/vol) solution of polyphenylamine in trimethylbenzene is applied using an inkjet method (20 pL per droplet) so as to cover the source electrodes and the drain electrodes, and then dried at 60° C. for 10 minutes. Thus, the organic semiconductor layer with an average thickness of 50 nm is formed.

And then, 6% (wt/vol) solution of polyvinylphenol in butyl acetate is applied on the glass substrate using the spin coating process (2400 rpm), and then dried at 60° C. for 10 minutes. Thus, the gate insulating layer with an average thickness of 400 nm is formed.

Subsequently, a silicon mold provided with a plurality of straight grooves formed thereon is pressed against the gate insulating layer so that the grooves are aligned in parallel to a direction in which the gate electrodes are formed. Then, in this condition, the silicon mold is heated and then cooled down. Thus, a plurality of grooves (50 nm in depth, 100 nm in width, and 100 nm in the distance between the grooves) having the inverse shape of the mold is formed on the opposite surface of the gate insulating layer to the glass substrate.

Subsequently, droplets (B/A 300) of a water dispersion (viscosity of 6 cps (room temperature)) of PEDOT are provided on the gate insulating layer using the inkjet process so as to overlap the sections corresponding to the areas in which the source electrode fingers and the drain electrode fingers engage, and then calcined in the atmosphere at 150° C. for 15 minutes. Thus, the gate electrode with an average thickness of 800 nm and an average width of 25 μm is formed.

The active matrix device shown in FIG. 1 is manufactured through the above steps.

Specific Example 2

Except that the step 12 described above is modified to the step 12' described below, the active matrix device shown in FIG. 1 is manufactured in the same manner as the specified example 1. Note that, in this case, the relationship (D/C) between the diameter of the droplet as landing and the distance between the lyophilic sections, and the average thickness and the average width of the gate electrodes implemented in the active matrix device are 200 in D/C, 730 nm in average thickness, and 22 µm in average width, respectively.

12'. Firstly, a process liquid prepared by dissolving (tridecafluoro-1,1,2,2 tetrahydrooctyl)triethoxysilane (a silane coupling agent) with toluene to be 0.1 wt % is provided on the opposite surface of the gate insulating layer to the glass substrate using the spin-coating process, and then a heat process is applied at 100° C. for 10 minutes to dry the process liquid.

Subsequently, the coupling agent attached to the gate insulating layer is removed in a strip manner by irradiating with an excimer laser beam in a constant interval along the direction in which the gate electrodes are to be formed. Thus, the lyophobic sections composed of the silane coupling agent and the lyophilic sections composed of the areas from which the silane coupling agent is removed are formed alternately (150 nm in width of the lyophobic sections, 150 nm in width of the lyophilic sections) on the opposite surface of the gate insulating layer to the glass substrate.

Specific Example 3

Except that the step 12 described above is modified to the step 12" described below, the active matrix device shown in FIG. 1 is manufactured in the same manner as the specified example 1. Note that, in this case, the relationship (B/A) between the diameter of the droplet as landing and the distance between the grooves, and the average thickness and the average width of the gate electrodes implemented in the active matrix device are 1000 in B/A, 850 nm in average thickness, and 20 µm in average width, respectively.

12". Firstly, a process liquid prepared by dissolving (tridecafluoro-1,1,2,2 tetrahydrooctyl)triethoxysilane (a silane coupling agent) with toluene to be 0.1 wt % is provided on the opposite surface of the gate insulating layer to the glass substrate using the spin-coating process, and then a heat process is applied at 100° C. for 10 minutes to dry the process liquid.

Subsequently, the grooves are formed on the opposite surface of the gate insulating layer to the glass substrate and at the same time the coupling agent attached to the areas in which the grooves are formed is also removed by applying the rubbing process using a rubbing device along the direction in which the gate electrodes are to be formed. Thus, a plurality of grooves (10 nm in depth, 30 nm in width, and 30 nm in distance between the grooves) are formed along the direction in which the gate electrodes are to be formed, and the lyophobic films composed of the silane coupling agent are also formed in the areas between the grooves.

Comparative Example

Except that the step 12 described above is omitted, the active matrix device shown in FIG. 1 is manufactured in the same manner as the specified example 1.

Note that the average thickness and the average width of the gate electrodes implemented in the active matrix device are 350 nm in average thickness and 50 µm in average width, respectively.

Regarding each of the thin film transistors implemented in the active matrix devices of the specific examples described above and the comparative example, a value of the ratio (on/off) of the absolute value of the off current and the absolute value of the on current is obtained.

Here, the off current denotes a value of a current flowing between the source electrode and the drain electrode when the gate voltage is not applied, and the on current denotes a value of a current flowing between the source electrode and the drain electrode when the gate voltage is applied. Therefore, it is denoted that the larger the value of the on/off ratio is, the better characteristic the organic TFT has.

As a result, the thin film transistors implemented in the specific examples have the on/off ratio substantially ten times as large as that of the comparative example, which shows that the thin film transistors of the specific examples have superior characteristics in comparison with that of the comparative example.

It can be inferred that the result is caused by the reduction of the off current of the thin film transistor in which the gate electrodes with small widths are formed, as is the case with the specific examples, to reduce the areas where the gate electrodes overlap either of the source electrodes or the drain electrodes.

What is claimed is:

1. A method of manufacturing a semiconductor device, the method comprising:
   forming a source electrode and a drain electrode on a substrate;
   forming a semiconductor layer on the source and the drain electrode;
   forming a gate insulating layer on the semiconductor layer;
   forming a plurality of first regions extending in a predetermined direction on the gate insulating layer;
   forming a plurality of second regions on the gate insulating layer, the plurality of first regions and the plurality of second regions being formed alternatively, the plurality of second regions being more lyophilic than the plurality of first regions; and
   ejecting a liquid material on the plurality of first and second regions, the liquid material being formed overlapping the plurality of first regions.

2. A method of manufacturing a semiconductor device, comprising:
   forming a first region, a second region, and a third region in a first film, the forming of the first region and the third region including forming the first region and the third region by a physical treatment, the second region being positioned between the first region and the third region, the first region and the third region being formed to cause anisotropy in an extending direction of a liquid material; and
   depositing the liquid material on the first region, the second region, and the third region to form an electrically conductive film.

3. The method of manufacturing the semiconductor device according to claim 2, the physical treatment including a rubbing method.

4. The method of manufacturing the semiconductor device according to claim 2, the first region and the third region being grooves.

5. The method of manufacturing the semiconductor device according to claim 4, the grooves have a depth in a range of 0.1 through 1000 nm.

6. The method of manufacturing the semiconductor device according to claim 2, the first film being made of an organic polymeric material.

7. The method of manufacturing the semiconductor device according to claim 2, further comprising:
  reducing a wettability of a surface of the first film before the forming of the first region and the third region.

8. A method of manufacturing a semiconductor device, comprising:
  depositing a lyophobic material on a first film in a direction in which an electrically conductive film is to be formed, the first film having a first portion with the lyophobic material, a second portion without the lyophobic material and a third portion with the lyophobic material, the second portion being positioned between the first portion and the third portion; and
  depositing a liquid material on the first portion, the second portion and the third portion to form the electrically conductive film.

9. The method of manufacturing the semiconductor device according to claim 8, further comprising:
  removing a portion of the lyophobic material that is formed on an area other than the electrically conductive film is to be formed before the depositing of the liquid material.

10. The method of manufacturing the semiconductor device according to claim 8, further comprising:
  conducting a physical treatment before the depositing of the lyophobic material on the first film.

11. A method of manufacturing a semiconductor device, comprising:
  forming a source electrode and a drain electrode on a substrate;
  forming a semiconductor film above the source electrode and the drain electrode;
  forming an insulating film above the semiconductor film, the insulating film being formed to have a first region, a second region, and a third region, the second region being positioned between the first region and the third region, the first region and the third region being formed to cause anisotropy in an extending direction of a liquid material; and
  depositing liquid material on the first region, the second region, and the third region to form a gate electrode.

12. The method of manufacturing the semiconductor device according to claim 11, the forming of the first region and the third region including forming the first region and the third region by a physical treatment that includes a transfer method.

13. The method of manufacturing the semiconductor device according to claim 11, the forming of the first region and the third region including depositing a lyophobic material on the first region and the third region.

14. A method of manufacturing a semiconductor device, comprising:
  forming a first region, a second region, and a third region in a first film made of an organic polymeric material, the second region being positioned between the first region and the third region, the first region and the third region being formed to cause anisotropy in an extending direction of a liquid material; and
  depositing the liquid material on the first region, the second region, and the third region to form an electrically conductive film.

* * * * *